United States Patent
Wang et al.

(10) Patent No.: US 11,734,211 B2
(45) Date of Patent: Aug. 22, 2023

(54) COMPUTING DEVICE WITH CIRCUIT SWITCHED MEMORY ACCESS

(71) Applicant: Axis Semiconductor, Inc., Methuen, MA (US)

(72) Inventors: Xiaolin Wang, Methuen, MA (US); Qian Wu, Redwood City, CA (US)

(73) Assignee: Axis Semiconductor, Inc., Methuen, MA (US)

( * ) Notice: Subject to any disclaimer, the term of this patent is extended or adjusted under 35 U.S.C. 154(b) by 73 days.

(21) Appl. No.: 17/441,392

(22) PCT Filed: Mar. 20, 2020

(86) PCT No.: PCT/US2020/023765
§ 371 (c)(1),
(2) Date: Sep. 21, 2021

(87) PCT Pub. No.: WO2020/197964
PCT Pub. Date: Oct. 1, 2020

(65) Prior Publication Data
US 2022/0171731 A1    Jun. 2, 2022

Related U.S. Application Data

(60) Provisional application No. 62/824,054, filed on Mar. 26, 2019.

(51) Int. Cl.
*G06F 13/40* (2006.01)
(52) U.S. Cl.
CPC .............................. *G06F 13/4022* (2013.01)
(58) Field of Classification Search
None
See application file for complete search history.

(56) References Cited

U.S. PATENT DOCUMENTS

| 8,181,003 B2 | 5/2012 | Wang et al. |
| 2002/0031124 A1 | 3/2002 | Shuo-Yen |

(Continued)

FOREIGN PATENT DOCUMENTS

KR    1020130066401 A1    6/2013

OTHER PUBLICATIONS

Intnl Search Report & Written Opinion for PCT/US2020/023765 dated Jul. 14, 2020, 14 Pages.

(Continued)

*Primary Examiner* — Farley Abad
*Assistant Examiner* — Dayton Lewis-Taylor
(74) *Attorney, Agent, or Firm* — Maine Cernota & Rardin

(57) ABSTRACT

A computing device includes a transport switch comprising read and write switches that provide switched circuit interconnections between input and output ports for simultaneous data communication between a plurality of memory clients and a plurality of memory banks, such as between cores of a multi-core processor simultaneously accessing L1, L2, and L3 memory banks. Embodiments implement switching designs that are derived from existing switched network architectures. Other embodiments implement a novel circuit switch design based on 8×8 building blocks. The transport switch can be non-blocking, and can be self-routing. An additional switching layer can be included to provide port rearrangement for rearrangeable non-blocking switches. A transport compiler can be used to determine port-pair configurations of the switch. A disclosed method selects optimal switch architectures for specific applications. Embodiments support simultaneous, multicast transfers of data retrieved from a memory bank to a plurality of memory clients.

16 Claims, 29 Drawing Sheets

(56) References Cited

U.S. PATENT DOCUMENTS

| | | | |
|---|---|---|---|
| 2005/0271073 A1* | 12/2005 | Johnsen | H04L 49/358 |
| | | | 370/428 |
| 2006/0221945 A1* | 10/2006 | Chin | H04L 49/90 |
| | | | 370/381 |
| 2009/0240866 A1 | 9/2009 | Kajigaya | |
| 2013/0275707 A1 | 10/2013 | Schenfeld et al. | |
| 2016/0044393 A1 | 2/2016 | Graves | |
| 2019/0058675 A1* | 2/2019 | Schubert | H04L 47/30 |

OTHER PUBLICATIONS

Intnl Preliminary Report on Patentability for PCT/US2020/023765 dated Oct. 7, 2021, 10 Pages.

\* cited by examiner

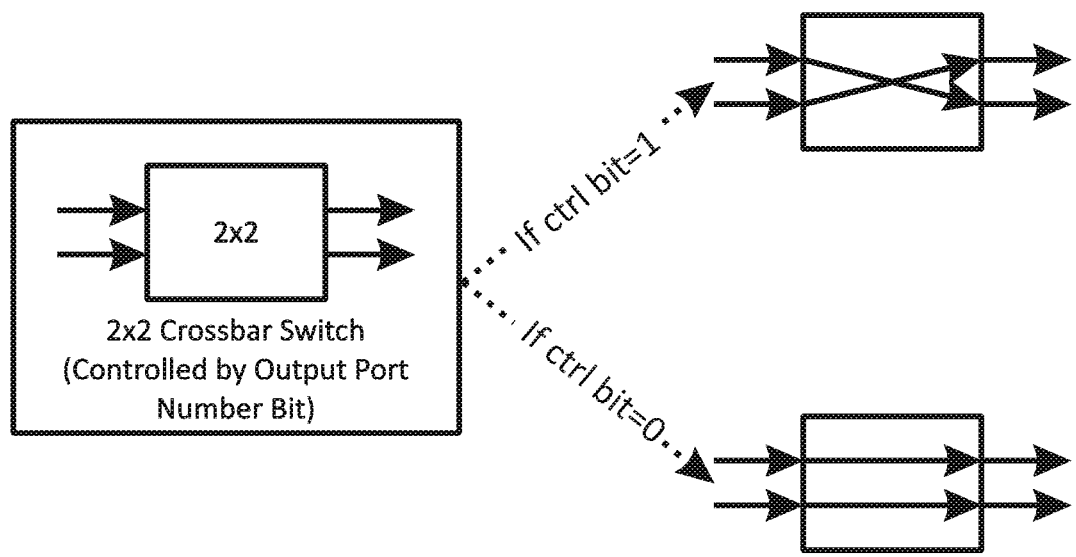
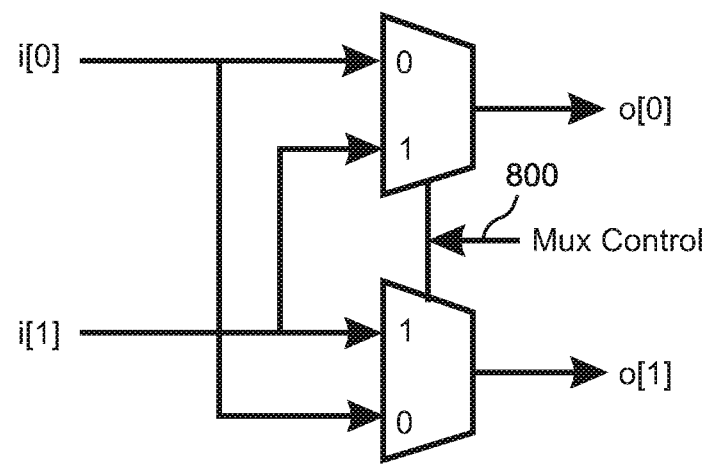
Fig. 8

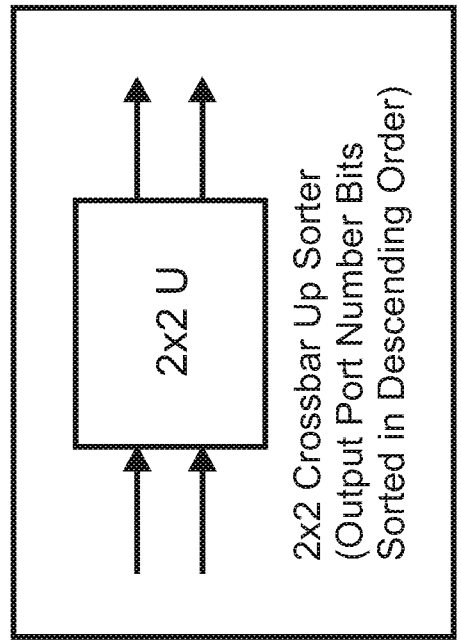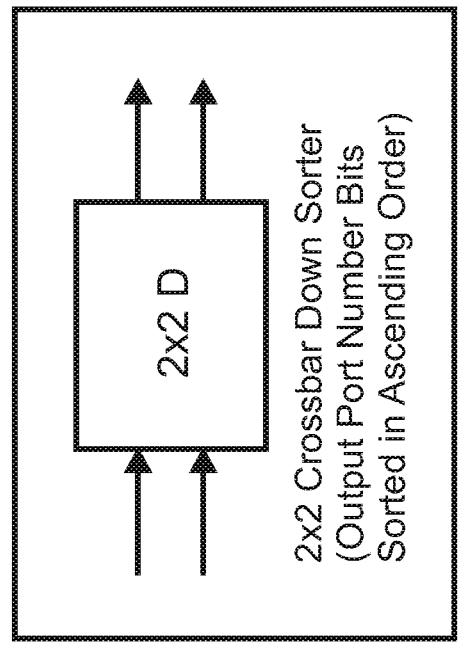
Fig. 9

| 1600 N Section | N/2 section (0) | Connection Between N/2 and N/4 sections as shown in Figure 17 | N/4 section (0) |
|---|---|---|---|
| | | | N/4 section (1) |
| | N/2 section (1) | Connection Between N/2 and N/4 sections as shown in Figure 17 | N/4 section (2) |
| | | | N/4 section (3) |
| Connection Between N and N/2 Sections as shown in Figure 17 | | | |

| 4 section (0) | Connection Between 4 & 2 sections as shown Fig 17 | 2 section (0) |
|---|---|---|
| | | 2 section (1) |
| 4 section (1) | | 2 section (2) |
| | | 2 section (3) |

| 4 section (N/4-2) | Connection Between 4 & 2 sections as shown Fig 17 | 2 section (N/2-4) |
|---|---|---|
| | | 2 section (N/2-3) |
| 4 section (N/4-1) | | 2 section (N/2-3) |
| | | 2 section (N/2-1) |

- TMU0 access MB0 - MB3 with 2D pattern of 4*4
- TMU1 access MB1 - MB5 with 2D pattern of 5*4
- TMU2 access MB2 - MB5 with 2D pattern of 4*6
- TMU3 access MB4 - MB8 with 2D pattern of 5*4

| MB0 | MB1 | MB2 | MB3 | MB4 | MB5 | MB6 | MB7 | MB8 |
|---|---|---|---|---|---|---|---|---|
| TMU0 access MB0 - MB3 with 2D pattern of 4*4 ||||| | | | |
| | TMU1 access MB1 - MB3 with 2D pattern of 3*4 (Region 1) ||| TMU1 Access MB4 (Region 2) | TMU1 Access MB5 (Region 3) | | | |
| | | TMU2 access MB2 - MB3 with 2D pattern of 2*4 (Region 1) || TMU2 access MB4 - MB5 with 2D pattern of 2*4 (Region 2) || | | |
| | | TMU2 access MB2 - MB5 with 2D pattern of 4*2 (Region 3) |||| | | |
| | | | | TMU3 access MB4 - MB7 with 2D pattern of 4*4 (Region 2) |||| TMU3 Access MB8 (Region 3) |

Fig. 25

| Cycles | MB0 | MB1 | MB2 | MB3 | MB4 | MB5 | MB6 | MB7 |
|---|---|---|---|---|---|---|---|---|
| 0 | TMU0 | TMU1 | TMU2 | | | | | |
| 1 | | TMU0 | TMU1 | TMU2 | | | | |
| 2 | | | TMU0 | TMU1 | TMU2 | | | |
| 3 | | | | TMU0 | TMU1 | TMU2 | | |
| 4 | TMU0 | TMU1 | TMU2 | | TMU4 | | | |
| 5 | | TMU0 | TMU1 | TMU2 | | TMU4 | | |
| 6 | | | TMU0 | TMU1 | TMU2 | | TMU4 | |
| 7 | | | | TMU0 | TMU1 | TMU2 | | TMU4 |
| 8 | TMU0 | TMU1 | TMU2 | | TMU4 | | | |
| 9 | | TMU0 | TMU1 | TMU2 | | TMU4 | | |
| 10 | | | TMU0 | TMU1 | TMU2 | | TMU4 | |
| 11 | | | | TMU0 | TMU1 | TMU2 | | TMU4 |
| 12 | TMU0 | TMU1 | TMU2 | | TMU4 | | | |
| 13 | | TMU0 | TMU1 | TMU2 | | TMU4 | | |
| 14 | | | TMU0 | TMU1 | TMU2 | | TMU4 | |
| 15 | | | | TMU0 | TMU1 | TMU2 | | TMU4 |

Fig. 26

| Cycles | MB0 | MB1 | MB2 | MB3 | MB4 | MB5 | MB6 | MB7 |
|---|---|---|---|---|---|---|---|---|
| 0 | TMU0 | TMU1 | TMU2 | | | | | |
| 1 | TMU0 | TMU1 | TMU2 | | | | | |
| 2 | TMU0 | TMU1 | TMU2 | | | | | |
| 3 | TMU0 | TMU1 | TMU2 | | | | | |
| 4 | | TMU0 | TMU1 | TMU2 | TMU4 | | | |
| 5 | | TMU0 | TMU1 | TMU2 | TMU4 | TMU4 | | |
| 6 | | TMU0 | TMU1 | TMU2 | TMU4 | TMU4 | | |
| 7 | | TMU0 | TMU1 | TMU2 | | TMU4 | | |
| 8 | | | TMU0 | TMU1 | TMU2 | | TMU4 | |
| 9 | | | TMU0 | TMU1 | TMU2 | | TMU4 | |
| 10 | | | TMU0 | TMU1 | TMU2 | | TMU4 | |
| 11 | | | TMU0 | TMU1 | TMU2 | | | |
| 12 | | | | TMU0 | TMU1 | TMU2 | | TMU4 |
| 13 | | | | TMU0 | TMU1 | TMU2 | | TMU4 |
| 14 | | | | TMU0 | TMU1 | TMU2 | | TMU4 |
| 15 | | | | TMU0 | TMU1 | TMU2 | | TMU4 |

Fig. 27

COMPUTING DEVICE WITH CIRCUIT SWITCHED MEMORY ACCESS

RELATED APPLICATIONS

This application is a national phase application filed under 35 USC § 371 of PCT Application No. PCT/US20/23765 with an international filing date of Mar. 20, 2020. Application PCT/US20/24765 claims the benefit of U.S. Provisional Application No. 62/824,054, filed Mar. 26, 2019. Both of these applications are incorporated herein by reference in their entirety for all purposes.

FIELD OF THE INVENTION

The invention relates to computing devices, and more particularly, to apparatus and methods for intercommunication between memory modules and memory clients within a computing device.

BACKGROUND OF THE INVENTION

Typically, the central processing unit ("CPU") of a computing device includes a plurality of "layers" or "levels" of on-chip and off-chip cache memory. The on-chip cache memory can include so-called level 1 or "L1" cache, also called the "primary" cache, which is the fastest memory in the computer, and level 2 "L2" cache that typically feeds the L1 cache and is also likely to be on-chip, although in some cases it is located on the motherboard or elsewhere off-chip. Level 3 or "L3" cache is usually located off-chip. Typically, each of these memory resources comprises a plurality of memory modules or "banks."

During the last two decades, multi-core processors have become increasingly common. Generally, they have inherited the same memory cache structure as had been developed for the earlier, single-core processors. As a result, the architectures of modern computing devices are required to provide memory intercommunication between a plurality of shared memory modules, or "banks," and a growing number of processing cores, input and output ports, and/or other memory clients.

One approach is to provide interconnection between shared memory and its clients via one or more busses. A typical example is illustrated in FIG. 1 where a CPU 100 is connected to memory 102 as well as to an input port 104 and an output port 106 by an address bus 108 and a data bus 110, under control of a control bus 112.

As the number of cores on these multi-core processor chips has increased to more than 10, and in some cases even more than 100, the number of memory clients 100, 104, 106 that share the cache memory resources 102 has increased significantly. As such, currently implemented strategies such as FIG. 1 that use buses 108, 110, 112 to form the connections between the cache memory resources 102 and their clients 100, 104, 106 have become inefficient, slow, and inadequate, and tend to waste large amounts of hardware resources, at least for the following reasons:

To increase bandwidth for data transfer between shared memory (cache) resources 102 and the memory clients 100, 104, 106, the data buses 110 are typically made very wide. For example, the data bus widths are typically either 32 bytes (L1 cache) or 64 bytes (L2 cache) for on-chip connections, and up to 512 bytes for off-chip cache access (e.g. L3 cache). According to this approach, for each transaction (i.e. transfer of data between a memory resource 102 and a memory client 100, 104, 106), the entire data bus (32B or 64B) 110 is used to transfer data between the shared memory 102 and one single memory client (e.g. 100) in a clock cycle.

It is expensive in terms of physical hardware to make wide buses 110 that can serve many different clients. For the bus 110 to reach multiple clients 100, 104, 106, it needs to be very long. This requires the bus 100 to be physically wide, and buffer circuitry is typically needed to meet increasing clock cycle requirements.

Because the data transfer on a bus is parallel, not serial, the data that is transferred over the bus during each clock cycle necessarily includes at least one entire "line" of data, where the "line" size is determined by the bus width, e.g. a single "line" of 32 bytes or 64 bytes. However, it often happens that a single core or other client cannot consume a full line of data per clock cycle, thereby requiring logical buffers to be included that can absorb the full lines of data as they are received from the data bus and then transfer the data at a slower rate to the client.

For multi-core or many-core systems, all of the clients share the same bus to access a shared cache memory resource comprising a plurality of memory banks. As a result, if a single client transfers a large amount of data all at once to or from a selected memory bank of a cache memory resource, all of the other clients are blocked from accessing the memory banks of that cache memory resource until the transfer is complete. For a system that uses "first come first served" arbitration, a single, long duration, low priority data transfer can temporarily block a plurality of shorter duration data transfers by other clients that may have greater urgency. As a result, program execution can be temporarily halted.

Because each memory access necessarily includes the transfer of an entire "line" of data, even if only a portion of a data line is actually needed, this can represent a significant waste of bandwidth. For example, in a typical access of a 16×16 2D pixel region from a picture formed by 1024×1024 pixels, each line of data only includes 16 entries. Therefore, when transferring the lines over a 32 word bus, one half of the bandwidth will be wasted, unless additional computing resources are applied to reorganize the 16×16 region into single lines of 32 words.

What is needed, therefore, is an apparatus and method for improving and optimizing the speed and efficiency of data transfer within a computing device between a plurality of shared memory banks and a plurality of memory clients.

SUMMARY OF THE INVENTION

The present invention is an apparatus and method for efficiently transferring data within a computing device between a plurality of shared memory banks and a plurality of memory clients, such as the cores of a multi-core processor, as well as input and output ports and other memory clients. Instead of relying on a bus architecture, the present invention implements circuit switching to interconnect the shared memory banks with the memory clients of the computing device. As a result, access by one memory client to a selected memory bank within a cache memory or other memory resource does not inhibit other clients from accessing other memory banks within that same resource.

While the invention is disclosed herein mainly with reference to shared memory, it will be understood by those of skill in the art that the present invention is also applicable to exchange of data between other elements of a computing device, such as between cores of a multi-core processor and shared input/output ports.

The circuit switching strategy that is implemented by the present invention shares some features in common with approaches that have previously been used to form interconnections between the nodes of a network that interconnects a plurality of separate, distributed computing devices. In the present case, however, circuit switching is implemented to improve intercommunication between resources that are included within a single computing device, and not over a network between separate computing devices. Nevertheless, a brief review of network switching architectures may be helpful to understanding the present invention.

A network environment can generally be described as a set of data links between nodes of the network that are mediated by one or more "switches." The function of each of the switches is to route data from specific input ports of the switch to specific output ports of the switch.

Different network switching strategies require different hardware designs with different amounts of resources. In general, however, it is fundamental to a network environment that the required pairings of input and output ports that will be required for each of the switches, and the timing thereof, is not known a priori. Instead, the switching requirements in a network are driven by human preferences and usage patterns that change from moment to moment. Accordingly, data switching networks must be able to accommodate all possible combinations of interconnection between the nodes, and all possible changes to the interconnections, with any possible timing and frequency.

Different types of network switches are characterized mainly by the strategies that they implement to create the pairings between their input and output ports. While there are many variations and sub-categories, network switches generally adopt one of two general strategies, which are "packet switching" and "circuit switching."

In packet switching, as is implemented for example by the internet, data is transmitted in bundles called "packets," each of which includes a "header" that carries a destination address that can be used by the various switches that control the network, such as "routers" and packet switches. Typically, each of the switches maintains a stored routing table that it applies to the destination address contained in each packet heater so as to correctly route each packet to an output port of the switch. Due to fluctuating traffic on the network, the actual route that is taken by each packet can vary according to the availability of the various links between the switches. As such, during a data transfer a dedicated link is not established between the source and destination nodes. Instead, each packet requires only momentary use of each of the links that it traverses between the switches as it is routed from the source node to the destination node, and it may even happen that different packets within the same data transmission take different routes through the network. This packet-switched approach is somewhat analogous to the routing of mail by a postal service, except that the routing is more variable and less predictable. This packet switched approach is robust and flexible, and is able to accommodate vast numbers of nodes. It is also suitable for network communication over coaxial cables and other "serial" connections, because the addresses and data are both included as bits within the same packet. Accordingly, there is no need for a switch to include separate address and data input ports. However, due to the overhead of reading packet headers and consulting routing tables, among other features, packet switching is not intrinsically efficient in terms of data transfer speeds.

Circuit switching, on the other hand, is generally able to provide more reliable communication with higher data transfer rates as compared to packet switching. According to the circuit-switched approach, each transfer of data is preceding by the establishment of a dedicated connection or "circuit" that extends from the source node through one or more switches to the destination node. Depending on the size and complexity of the network, a plurality of switches may be required. Unlike the switches in a packet-switched network, the switches in a circuit-switched network pre-establish a circuit connection from the source node through to the destination node before a data transfer commences, and this dedicated circuit connection is maintained in its entirety until the full data transmission has been completed.

In a circuit switched network, there is no need to organize the data into packets. Indeed, circuit switching is a close analog to traditional "copper wire" telephone networks, which successfully carried analog telephone calls for years before packets and digital communication were invented. In these traditional telephone networks, a separate, low speed signaling system known as "signaling system seven" or "SS7" was used to control the mechanical "crossbar" switches that were used to establish connections between handsets, after which analog voice signals were exchanged until at least one of the handsets was "hung up" (placed on hook) and the telephone call was terminated. Essentially the same concepts apply to modern network circuit switching, in that addressing information is used to pre-configure the intervening switches and establish a dedicated link between two nodes, and the link is then maintained until an entire exchange of data is completed.

The concept and terminology of a "crossbar" switch has carried over into modern circuit switching, whereby modern crossbar switches are no longer mechanical, but nevertheless perform essentially the same function as was once performed by the original telephone crossbar switches. It should be noted that a crossbar switch is a "non-blocking" switch, which means that if any selected output port does not already have an input port connected to it, the switch can find a path to connect any available input port to that output port. In other words, the establishment of any combination of input/output port connections within a non-blocking switch does not preclude the establishment of any desired additional connections between any combination of remaining input and output ports that have not yet been paired, so long as they do not conflict with the existing connections.

Obviously, it was important to implement crossbar switches in traditional telephone networks, so that any caller could call any other caller at any time, so long as neither one was already engaged in a call. Similar advantages apply to modern circuit switched networks. Notably, circuit switching is readily adapted to parallel data transfers, whereby the addressing information that is used to establish the dedicated links can be carried by separate, dedicated address lines or "bits" that are distinct from the lines that carry the data bits.

A type of theoretically idealized, multistage, non-blocking, circuit-switching network was invented by Edson Erwin in 1938, and was first formalized by Charles Clos in 1952. This approach is called a "Clos" network. An example is shown in FIG. 2. In the figure, an nr*nr Clos network is depicted that consists of three stages, which are the input stage 200, the middle stage 202, and the output stage 204. The input stage 200 includes a total amount "r" of n*m crossbar switches. The middle stage 202 includes a total amount "m" of r*r crossbar switches. The output stage includes a total amount "r" of m*n crossbar switches.

Clos networks have been proven to be able to switch any of their inputs to any of their outputs under the following conditions:
1. If m≥2n−1, the Clos network is non-blocking in a "strict" sense, meaning that an unused input of a switch that is included in the input stage 200 can always be connected to an unused output of a switch that is included in the output stage 204, without any need to re-arrange any existing connections 206, 208. In other words, no matter how or in what pattern the first rn-1 inputs are connected to outputs of the Clos network, the rn'th input can always find a connection to any desired, unoccupied output without disturbing any of the first rn-1 connections 206, 208.
2. If m≥n, the Clos network is "rearrangeably" non-blocking, meaning that an unused input on an input stage switch 200 can always be connected to any unused output on an output stage switch 204, but for this to take place existing connections 206, 208 may need to be rearranged by assigning them to different middle stage switches 202 in the Clos network. In other words, it is necessary to know the mapping 206, 208 of all of the input/output port pairs to configure the network.

Various algorithms have been proposed for rearranging the connections 206, 208 in a rearrangeably non-blocking Clos network. See for example the following references, all of which are incorporated herein in their entirety by reference for all purposes:
https://www.researchgate.net/publication/269053111_Routing_Algorithms_for_Clos_Interconnection_Networks
http://apt.cs.manchester.ac.uk/ftp/pub/apt/papers/Wei_ACSD10.pdf
https://ac.els-cdn.com/S1877050914015063/1-s2.0-S1877050914015063-main.pdf?_tid=732779cc-4a99-4d56-997e-25c8ad38fedb&acdnat=1550786703_f78e117b03ca7-a60288c99681920a0ee
https://arxiv.org/pdf/1109.0752.pdf In the present invention, a "transport switch" employs one or more circuit switches to form interconnections between a plurality of shared memory "banks" and a plurality of memory clients. In embodiments, each of the circuit switches comprises input ports and output ports that accept data and addressing bits in a parallel format. In other words, each input port of each of the read and write switches includes a plurality of input address bits and a plurality of input data bits. In embodiments, the circuit switches are non-blocking, and in some of these embodiments the circuit switches are strictly non-blocking, while in other of these embodiments the circuit switches are rearrangeably non-blocking.

Some embodiments that include rearrangeably non-blocking switches further include "tag memory" that is used to store "tag instructions" that control the internal configuration of the switch as needed to establish the required port interconnections without any blocking or loss of data. These tag instructions correspond by analogy to the SS7 instructions that were used in the past to configure traditional copper wire telephone circuits, as discussed above. In principle, a significant quantity of memory can be required so as to be able to store a unique tag instruction in the tag memory for each data transfer that is executed during program execution. Also, in some embodiments it is necessary to employ complex tag-computing algorithms so as to determine the required set of tag instructions for a given program execution. However, features are implemented in other embodiments of the present invention that mitigate or eliminate these requirements. For example, embodiments of the present invention implement one or more circuit switches or building-block modules within transport switches that are "self-routing," in that the address bits that indicate the output port number are themselves directly used to control the internal configuration that connects the selected input port to the selected output port. As such, the requirement for tag memory and for employing complex tag-computing algorithms can be significantly reduced or even eliminated.

In exemplary embodiments, the transport switch comprises a "transport read" switch and a "transport write" switch. In certain of these embodiments each input port of each of the transport read and write switches accept 64 input data bits and 20 input address bits, whereby the most significant bits of the address input control the configuration of the switch and the remaining bits of the address are directed to an address portion of the selected output port and are used to address data within the selected memory bank. For example, in embodiments the transport switch is a 512 port×512 port switch, and the nine most significant bits are used to control the configuration of the switch, while the remaining 11 address bits are used to address memory locations within a selected memory bank.

One general aspect of the present invention is a computing device having a plurality of memory banks interconnected with a plurality of memory clients by circuit switching, as described above.

A second general aspect of the present invention is a method of analyzing an addressing pattern of a software program and of controlling the configuration of a circuit switch as directed by said analysis so as to maximize the efficiency of data transfer between a plurality of memory banks and a plurality of memory clients within a computing device. For example, in some embodiments where the circuit switch is rearrangeably non-blocking, the analysis is used to minimize requirements for rearranging existing interconnections within the switch when accommodating new connections. The addressing pattern analysis thereby maximizes the effective read and write bandwidth that is provided by connecting the input and output ports of the switch to the memory banks in various different 1D and 2D address patterns. This approach provides to the memory clients fair and effective access to the shared memory banks through the various ports of the switch in all computing cycles, and reduces hardware resource requirements.

The disclosed invention assumes that the input/output pairing patterns of the switch in a live network cannot be predicted or pre-determined, and should not be restricted by the hardware. However, for a specific program or family of programs having specific memory access requirements, the programmer is able to design his/her program such that its memory storage and access requirements are known, as well as the timing pattern according to which the processor cores and/or other memory clients accesses the various memory banks during execution of the program. Accordingly, in another general aspect of the present invention, the computing device is configured such that program access is provided to the internal switching of the circuit switch, thereby enabling a programmer to optimize program code so as to take maximum advantage of the hardware design. Embodiments further enable a programmer, based on known timing and memory access requirements of his/her program, to include instructions in the program that will control the configuration of the circuit switch and optimize its performance, for example by avoiding collisions and minimizing any requirement for rearrangement of the switch configuration if the switch is a rearrangeable non-blocking switch.

Yet another general aspect of the present invention is a method of determining the characteristic input/output port pairing and timing requirements of a specific program or family of programs, and then using these determined characteristics to select a hardware design strategy for the circuit switch according to an optimal balancing of switch efficiency, hardware requirements, and ease of determining required switch configurations.

The present invention therefore replaces bus intercommunication, as used in current CPU architectures and other computing devices, with circuit switching to achieve efficient, simultaneous memory read/write access between a plurality of memory banks and a plurality of memory clients, including for multi-core and many-core processors and System-on a Chip ("SoC") designs.

Accordingly, one general aspect of the present invention is a computing device that includes a plurality of memory banks, a plurality of memory clients, and a transport switch having a plurality of first ports directed to the memory clients and a plurality of second ports directed to the memory banks. The transport switch includes a transport circuit switch that is configured to provide circuit-switched connection pairs between the first ports and the second ports so as to enable simultaneous data transfer connections between the memory banks and the memory clients during execution of a software application by the computing device.

In embodiments, at least one batcher sorter is implemented in the transport circuit switch.

In any of the above embodiments, at least one Banyan switch can be implemented in the transport circuit switch.

In any of the above embodiments, at least one Benes switch can be implemented in the transport circuit switch.

In any of the above embodiments, at least one self-routing switch can be implemented in the transport circuit switch.

In any of the above embodiments, the transport circuit switch can be constructed using self-routing 8-bit×8-bit building blocks, each of which comprises at least one 4-bit×4-bit self-routing, non-blocking sorter and at least one 4-bit×4-bit self-routing, non-blocking switch. In some of these embodiments the transport circuit switch includes a plurality of building block layers of the 8-bit×8-bit building blocks, and further includes an input position switch layer that precedes the building block layers. And in some of these embodiments the input position switch layer is controlled by tag instructions that are stored in tag memory associated with the transport switch.

In any of the above embodiments, at least some of the first and second ports can be configured to accept invalid inputs.

In any of the above embodiments, the transport circuit switch can include a read switch configured to enable the memory clients to read data from the memory banks and a write switch configured to enable the memory clients to write data to the memory banks.

In any of the above embodiments, each of the first ports can include a transport memory unit (TMU) interposed between the first port and the circuit switch.

In any of the above embodiments, the transport switch can be able to provide multicast transfer of data from at least one of the second ports simultaneously to a plurality of the first ports, thereby transferring the data to a plurality of the memory clients that is not necessarily all of the memory clients.

A second general aspect of the present invention is a method operable by a compiler of creating non-transient software code that is configured for execution by the computing device of claim 1 so as to cause the transport switch of claim 1 to enable efficient data exchange during execution of a software application between the memory banks and the memory clients of claim 1 while minimizing energy usage of the transport switch and while meeting timing requirements of the transport switch. The method includes the following steps:

a) extracting function block dependencies;
b) creating a plurality of parallel program execution threads across an execution time;
c) associating a start time signal with each of the threads, wherein the start time signal indicates a start of execution for that thread;
d) proposing a candidate assignment of at least one of the memory banks to each of the threads and a candidate memory accessing pattern as a function of time for each of the threads;
e) using the start time signals as time references, for each of a plurality of program periods, assigning to each of the threads a time slot and a plurality of memory access clock cycles during which the thread will exchange data with its assigned memory banks;
f) assigning computing resources to execute the threads;
g) according to the memory bank assignments, memory accessing patterns, and memory access clock cycles, for each clock cycle of the application software program determining a configuration of first and second port pairings to be interconnected by the circuit switch during that clock cycle;
h) repeating steps d) through g) as needed until none of the port pairings results in an internal collision of the circuit switch, and the configuration of port pairings meets data access timing requirements of the application software program; and
i) generating memory access and synchronization code for the application software program.

In embodiments, steps d) through f) are performed according to an approach that applies either a heuristic search or algorithmic programming to minimize energy use of the transport switch.

A third general aspect of the present invention is a method of selecting an architecture for a circuit switch to be included in a transport switch configured to provide intercommunication between a plurality of memory banks and a plurality of memory clients as described in claim 1, wherein the circuit switch is to be implemented on an integrated circuit (IC) having shared memory thereupon that will be accessible to the circuit switch by means of a plurality of memory access ports under control of an application program. The method includes the following steps:

a) determining first and second time intervals;
b) determining a group of candidate circuit switch architectures that can be implemented by the circuit switch, said group including a Batcher-Banyan architecture, a Benes architecture, and a PROTS architecture constructed using 8×8 non-blocking, self-routing building blocks;
c) if the memory access ports have addresses that are sorted in ascending order, selecting the Banyan architecture from the group of architectures;
d) if a selection is not made according to c), then if the application program will not require changes to pairings of the first and second ports of the transport switch more frequently than once per second time interval:
selecting the Benes architecture from the group of architectures; and configuring a transport compiler to determine the required pairings of the first and second ports of the circuit switch;

e) if a selection is not made according to c) or d), and if the transport switch will require assignment thereto of less than 10% of the IC's computing resources, then selecting the Batcher-Banyan architecture from the group of network architectures;

f) if a selection is not made according to c), d), or e), and if the application program will require changes to the pairings of the first and second ports of the transport switch more frequently than once per first time interval, then selecting the PROTS switch architecture from the group of network architectures; and g) implementing a circuit switch on the IC that incorporates the selected architecture to provide switched circuit data intercommunication between the plurality of memory banks and the plurality of memory clients; and h) if a selection is not made according to any of c) through f), then selecting an architecture that will minimize an area of silicon that will be occupied by the circuit switch.

In embodiments, step g) includes selecting an architecture for which a total area of silicon occupied by the circuit switch is minimized, including a total area of silicon occupied by the building blocks of the circuit switch, and a total area of silicon occupied by tag memory associated with the circuit switch according to a size of each tag and a quantity of stored tags that will be required by the selected architecture.

In any of the above embodiments, the first and second time intervals can be one day and one week, respectively.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIGS. 8 and 9 are block diagrams that illustrate the function of a 2×2 crossbar switch as implemented in embodiments of the present invention;

FIG. 16 is a block diagram that illustrates an N×N "PROTS" switch as implemented in embodiments of the present invention that uses the 8×8 switches of FIG. 15 as a building block;

FIG. 24 is a block diagram that illustrates an example of shared memory access as determined by a transport compiler in an embodiment of the present invention;

FIG. 25 is a block diagram that illustrates separating memory into sections by a transport compiler in an embodiment of the present invention;

FIG. 26 is a block diagram that illustrates a first example of a cycle-by-cycle memory access pattern as determined by a transport compiler in an embodiment of the present invention; and FIG. 27 is a block diagram that illustrates a second example of a cycle-by-cycle memory access pattern as determined by a transport compiler in an embodiment of the present invention.

DETAILED DESCRIPTION

The present invention is an apparatus and method for efficiently transferring data within a computing device between a plurality of shared memory banks and a plurality of memory clients, such as the cores of a multi-core processor, input and output ports, and other memory clients. Instead of relying on a bus architecture, the present invention includes a device referred to herein as a "transport switch" that implements circuit switching to form connections between the shared memory banks and associated memory clients of the computing device. As a result, a plurality of the memory banks can be accessed by various of the memory clients during a single cycle of the computing device. In embodiments, any combination of the memory banks can be accessed by any combination of the memory clients during a cycle computing cycle, so long as there are no conflicts. For example, in embodiments if "n" memory banks are included, then a total of n data elements can be read from or written to memory during a single cycle. In embodiments, the memory input and output ports and the circuit switch are each configured to read or write bits in parallel according to a specified "word length," which in embodiments can be 16 bits, 32 bits, or 64 bits. Accordingly, in some of these embodiments n words of data can be exchanged with the memory banks during each computing cycle. Examples can include exchange of data between memory banks and cores of a multi-core microprocessor, as well as between memory banks and input/output ports.

In certain embodiments the transport switch further supports "multicast" transfer of data from a given memory bank simultaneously to a plurality of memory clients.

While the invention is disclosed herein mainly with reference to shared memory, it will be understood by those of skill in the art that the present invention is also applicable to exchange of data between other elements of a computing device, such as between cores of a multi-core processor and shared input/output ports.

Figure 1:
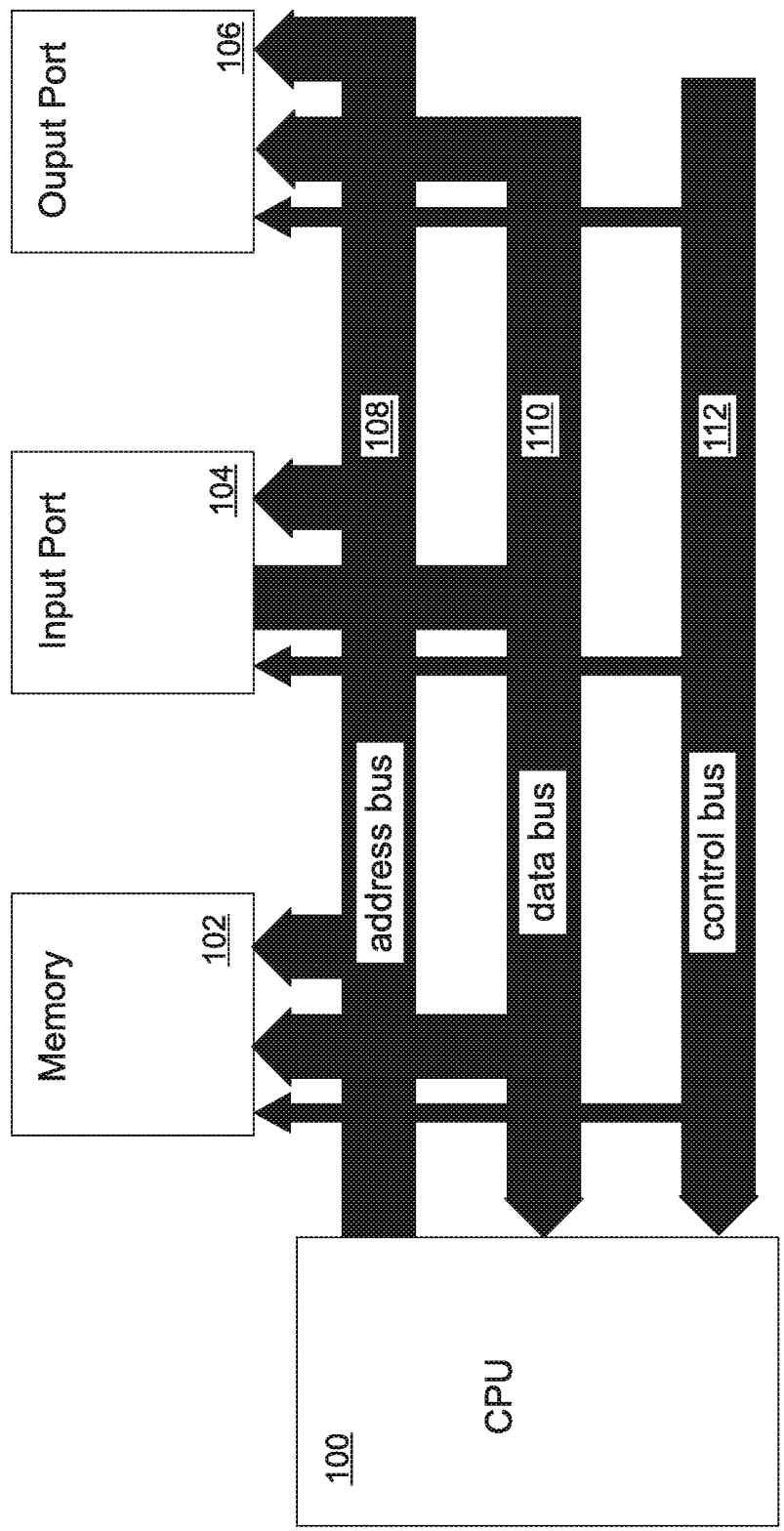
FIG. 1 is a block diagram illustrating a memory access bus configuration of the prior art.
Figure 2:
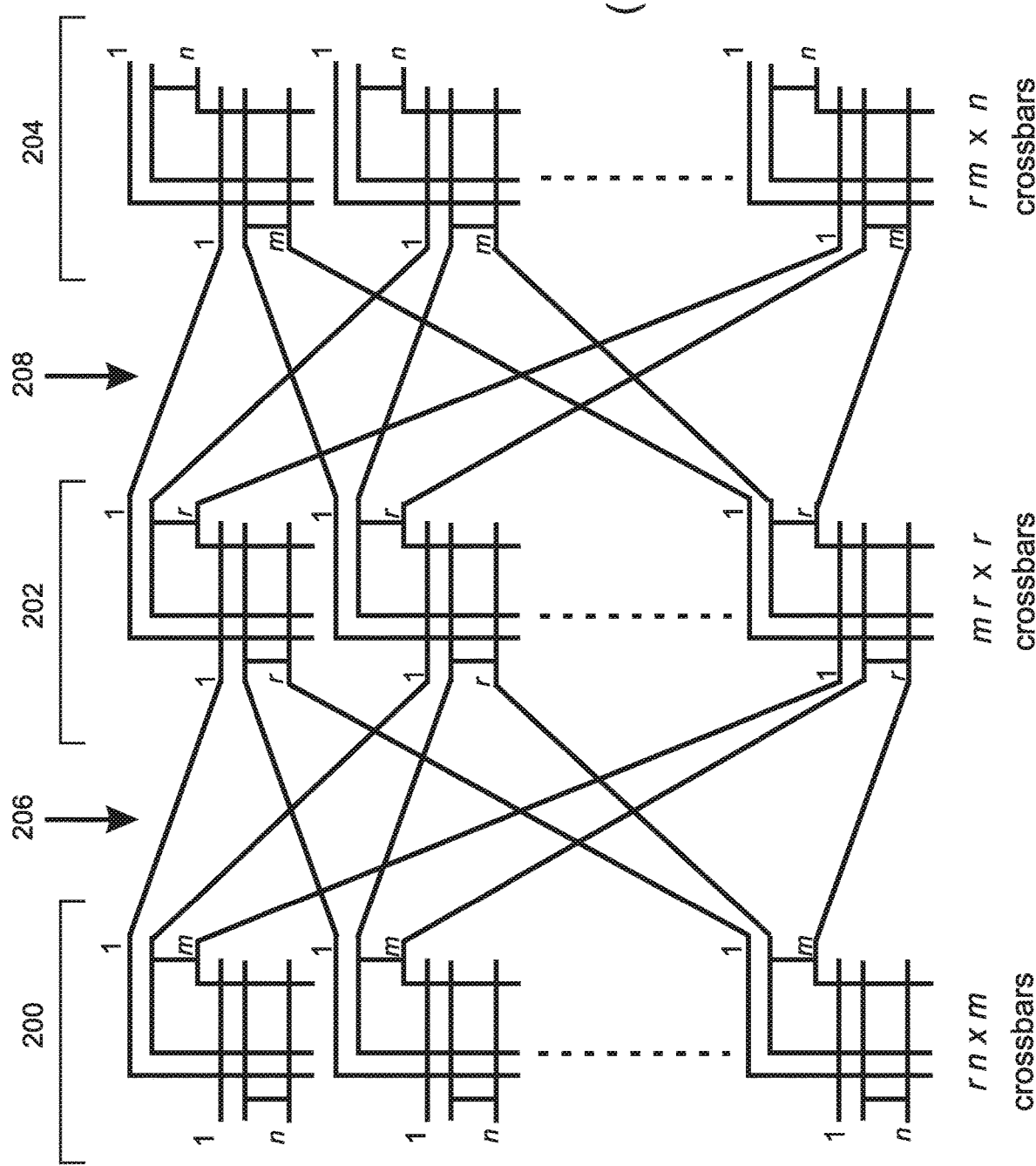
FIG. 2 is a block diagram illustrating a Clos network of the prior art.
Figure 3:
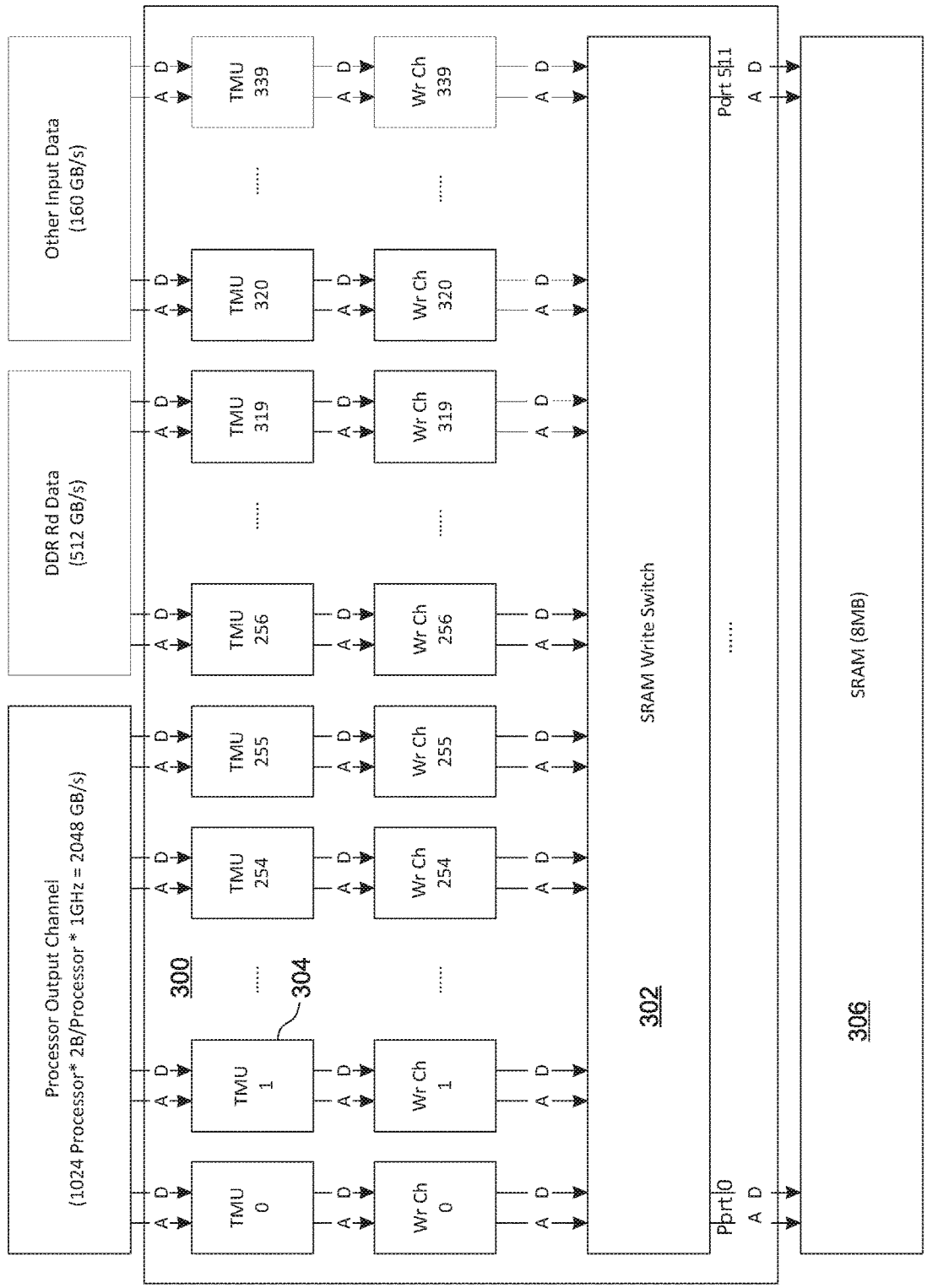
FIG. 3 is a block diagram of a transport write circuit switch in an embodiment of the present invention.
Figure 4:
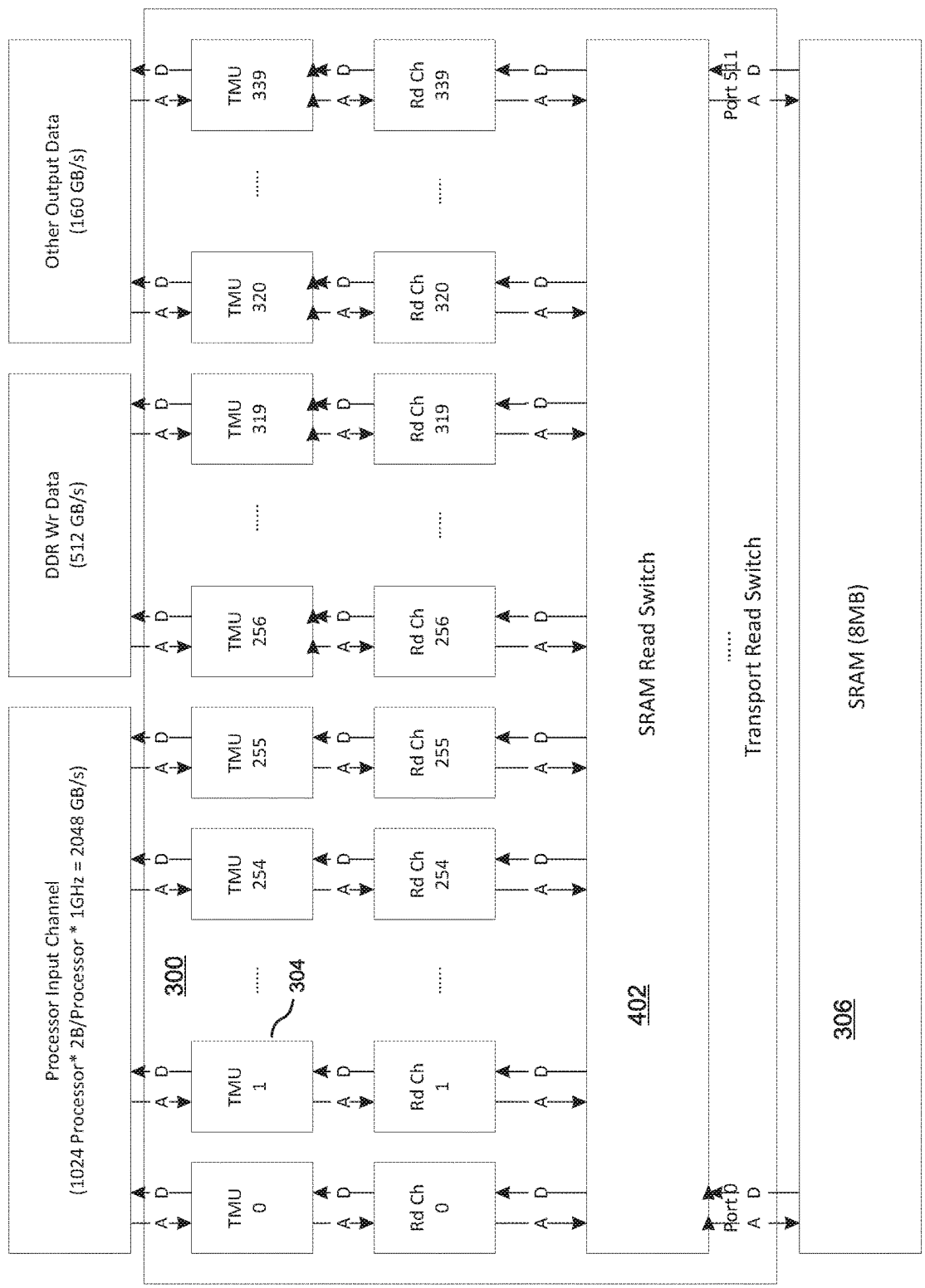
FIG. 4 is a block diagram of a transport read circuit switch in an embodiment of the present invention.
Figure 5:
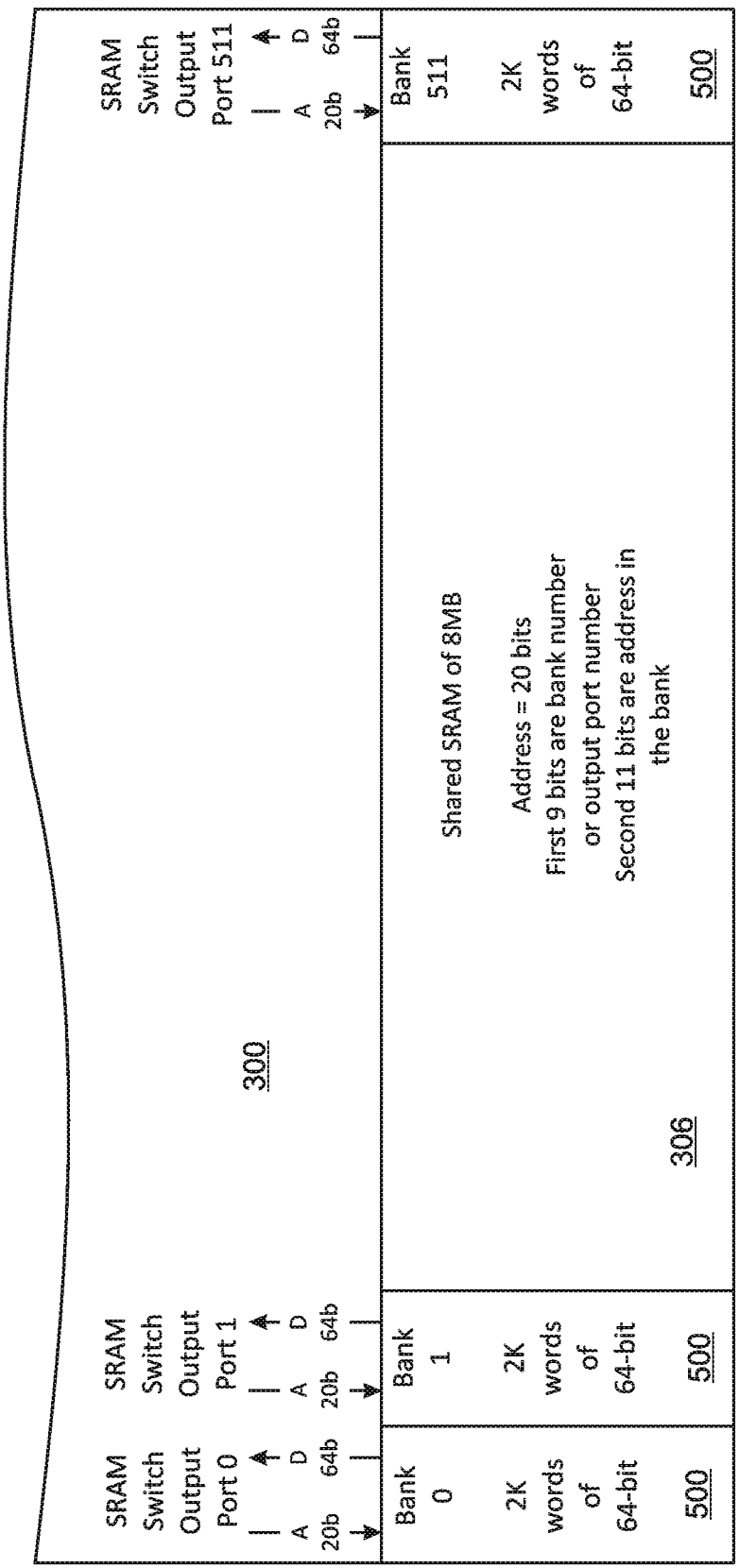
FIG. 5 is a block diagram that illustrates address, memory bank, and output port numbering for the read switch of FIG. 4.

In embodiments, the transport switch comprises a transport circuit switch that includes a transport write switch 302 and a transport read switch 402, embodiments of which are illustrated respectively in FIGS. 3 and 4. As shown in FIG. 5, an I/O port of the transport switch 300 is directed to each of the memory banks 500 of the shared memory resource 306. FIG. 5 illustrates the organization of the SRAM Address, Bank Number and Output Port Number in the Read Switch 402 of FIG. 4. The organization would be reversed, i.e. in the opposite direction, for the write switch 302 of FIG. 3.

In embodiments, the transport write switch 302 is unidirectional, in that it directs both address bits and data in the same direction, i.e. from the memory clients to the memory banks, while the transport read switch 402 is bi-directional, in that it directs address bits from the memory clients to the memory banks, while directing return data in the opposite direction, from the memory banks to the clients. Configuration of the forward and return paths in the transport read switch 402 can be independent, e.g. controlled by tag instructions. In other embodiments where the transport read switch 402 is partly or fully self-routing, the client pre-establishes the data return circuit configuration while sending the memory bank address forward through the read switch. In some of these embodiments, an extra shallow FIFO storage is associated with each control modules in the data return portion of the transport read switch to compensate for the latency of the returning data. The port address of the memory client can be included with the addressing information, or the data return configuration can be derived for example by "inverting" the "forward" address circuit configuration. For example, if the self-routing process is expressed as a pseudo matrix operation O=RI (where O is the output configuration, I is the input configuration, and R is the routing "matrix"), then the return routing "matrix" can be expressed in these embodiments as $I=R^{-1} O$, where $R^{-1}$ is derived by "inverting" R.

Embodiments further support "multicast" data transfer, whereby data retrieved from a memory bank is simultaneously directed to a plurality of memory clients, but not necessarily to all of the memory clients. In some of these embodiments, the clients establish the return circuits while sending the memory bank address forward, which is stored in the extra shallow FIFO. Once the data has been retrieved from the memory bank, it is then transferred simultaneously over the pre-established return circuits to the plurality of memory clients.

Figure 6:
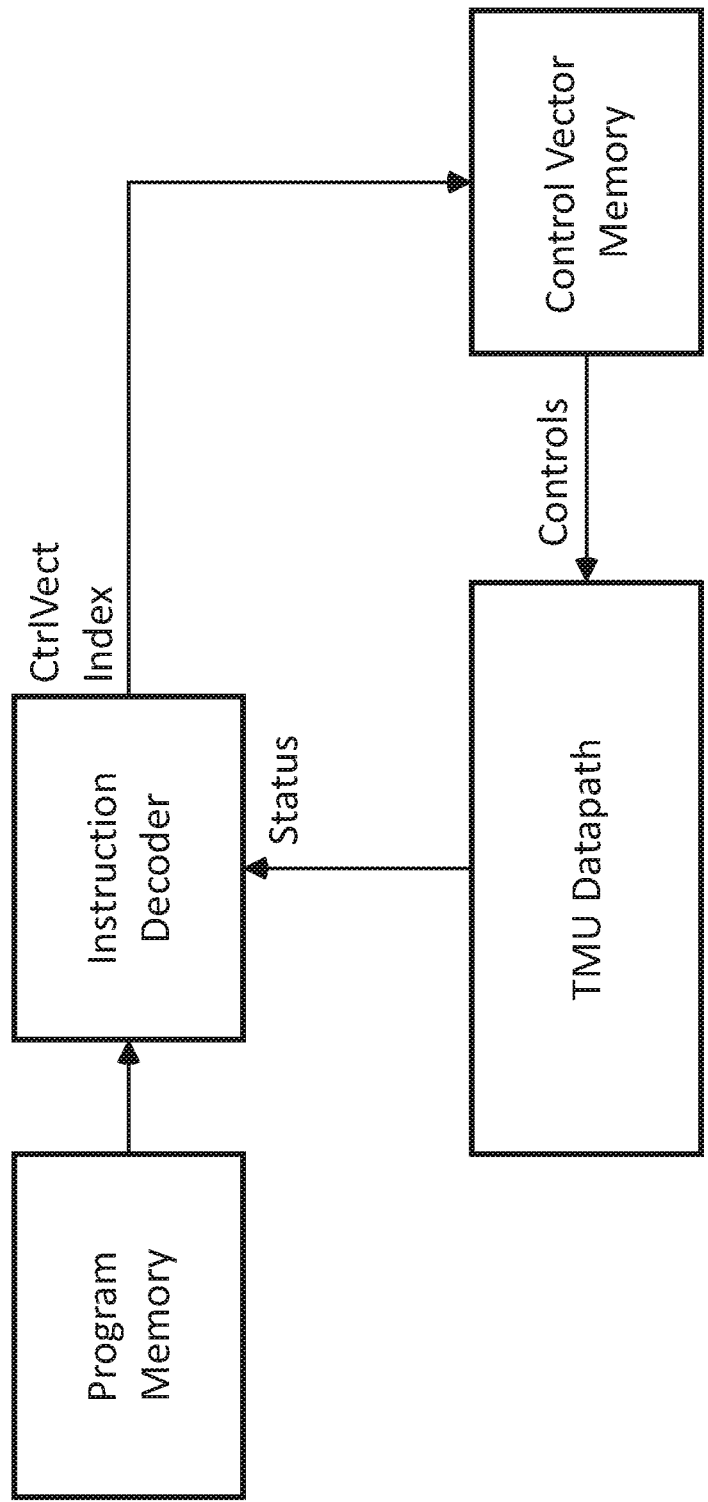
FIG. 6 is a block diagram that illustrates a TMU in an embodiment of the present invention.
Figure 7:
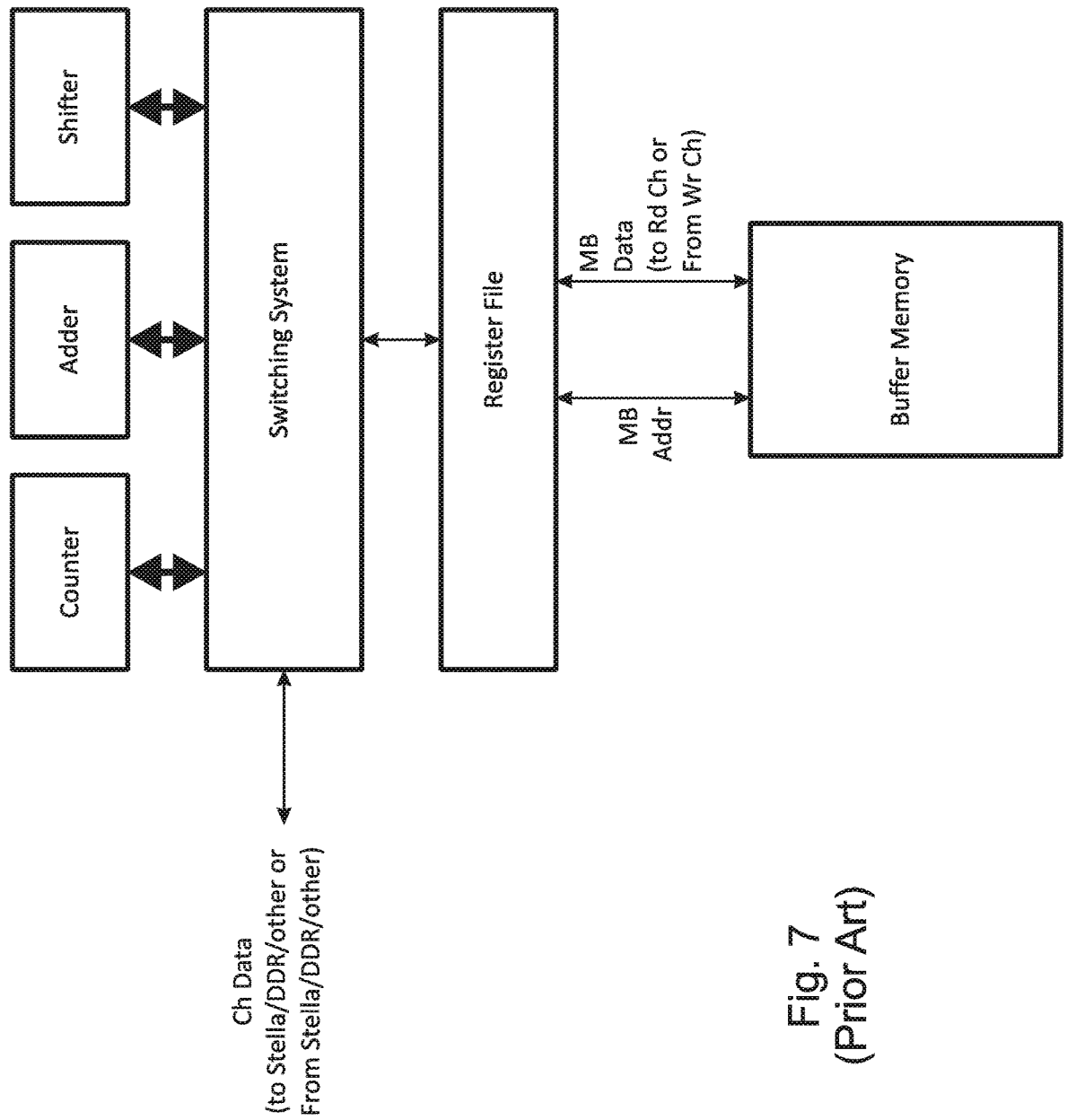
FIG. 7 is a block diagram that illustrates data paths of the TMU of FIG. 6.

In the embodiment of FIGS. 3 and 4, a "transport memory unit" or "TMU" 304 is interposed between each of the memory client input and output ports of the transport switch 300 and the transport read and write switch's 302, 402. As is illustrated by the TMU design of FIG. 6 and the TMU data path of FIG. 7, in response to control vectors that are decoded from program memory, and according to the embodiment and the requirements of the specific application, the TMUs can perform buffering and/or manipulations of data and/or addressing bits. In embodiments, each TMU can incorporate the structure and/or functionality of one "read side interface" or "write side interface" as are described in more detail with reference to FIGS. 6 and 7 in U.S. Pat. No. 8,181,003, which is incorporated herein by reference in its entirety for all purposes. As an example, in embodiments the TMU's can be used to generate addresses based on input read/write commands from processor cores, and/or to manipulate input data so as to convert a rectangular data set that is received as a series of rows so that it can be forwarded to the transport write switch as a series of columns.

In general, the transport switch 300 is an N×N circuit switch having N input ports and N output ports. N can take on any value. However, in embodiments N is a power of 2, in certain embodiments N is a power of 8, and in an exemplary embodiment N=512. Overall design goals of the transport switch, according to specific applications, is to require as little hardware as possible, to render programming of the switch control as easy as possible (in embodiments via input of physical addresses), to maximize the bandwidth usage according to 1D and 2D addressing patterns of the implemented programs, and if possible to minimize memory access latency and ease of complier development.

If the N*N transport switch is constructed from 2×2 crossbars, all of the layers can have collisions. This is too many possible collision locations One possibility is to implement a Banyan network design in the transport switch with $\log_2$ N layers of N/2 2×2 crossbars in each layer, as shown by the N×N switch of FIGS. 16 and 17. Note that the N section 1600 of FIG. 16 includes a total of N/2 2×2 crossbar switches. For example, if N=512, there will be 9 types of sections in 9 levels, as follows: Level 0: the 512 section; Level 1: 256 sections; Level 2: 128 sections; Level 3: 64 sections; Level 4: 32 sections; Level 5: 16 sections; Level 6: 8 sections; Level 7: 4 sections; and Level 8: 2 sections.

Figure 17:
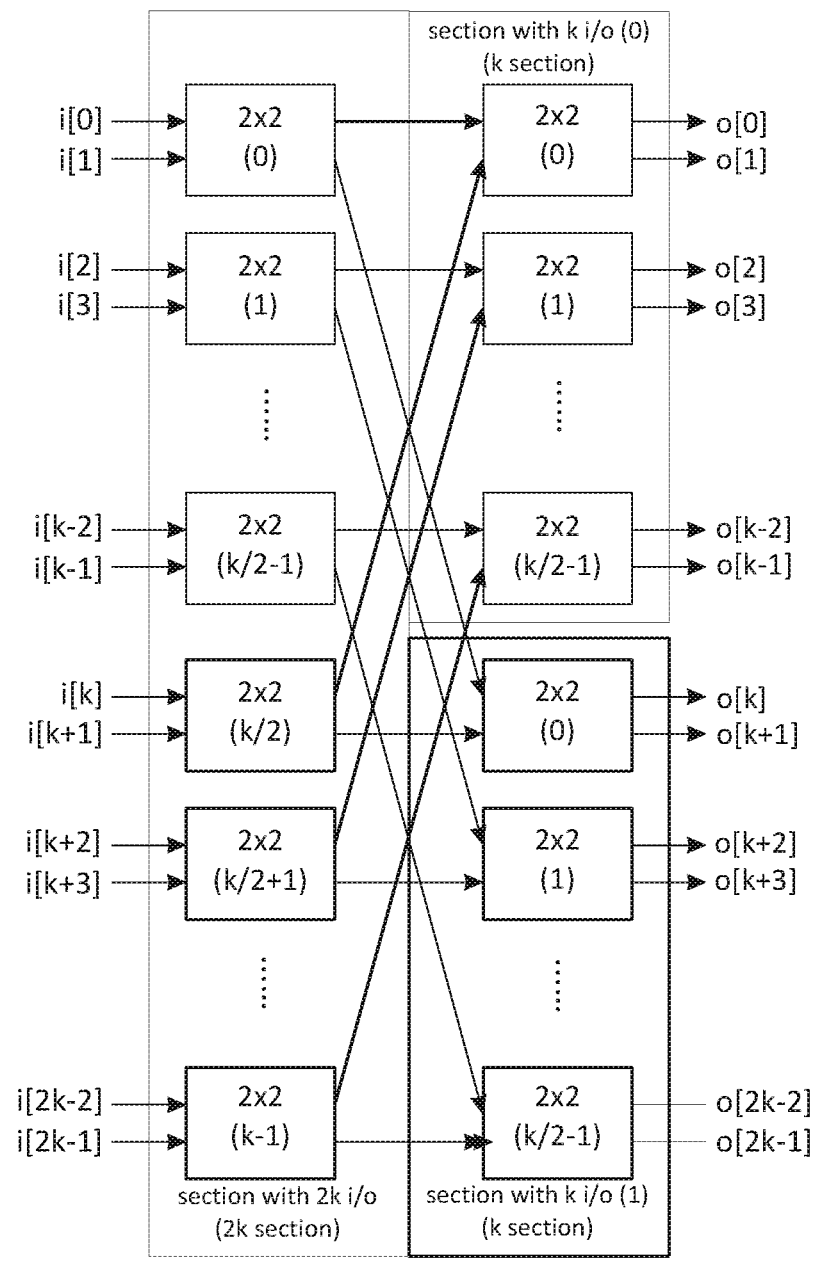
FIG. 17 is a block diagram that illustrates connection between 2k blocks and k blocks in an N×N switch using 2×2 crossbar switches, as implemented in embodiments of the present invention.

FIG. 17 illustrates the connection details between 2k blocks and k blocks in the N×N switch of FIG. 16 using 2×2 crossbars (k=2, 4, 8, . . . N/2), where the connection from Section 2k to k(0) includes connection from o[0] of 2×2(j) and o[0] of 2×2 (k/2+j) in section 2k to 2×2(j) in section k(0), and the connection from Section 2k to k(1) includes connection from o[1] of 2×2(j) and o[1] of 2×2 (k/2+j) in section 2k to 2×2(j) in section k(1), where j=0, 1, . . . k/2−1.

Figure 18:
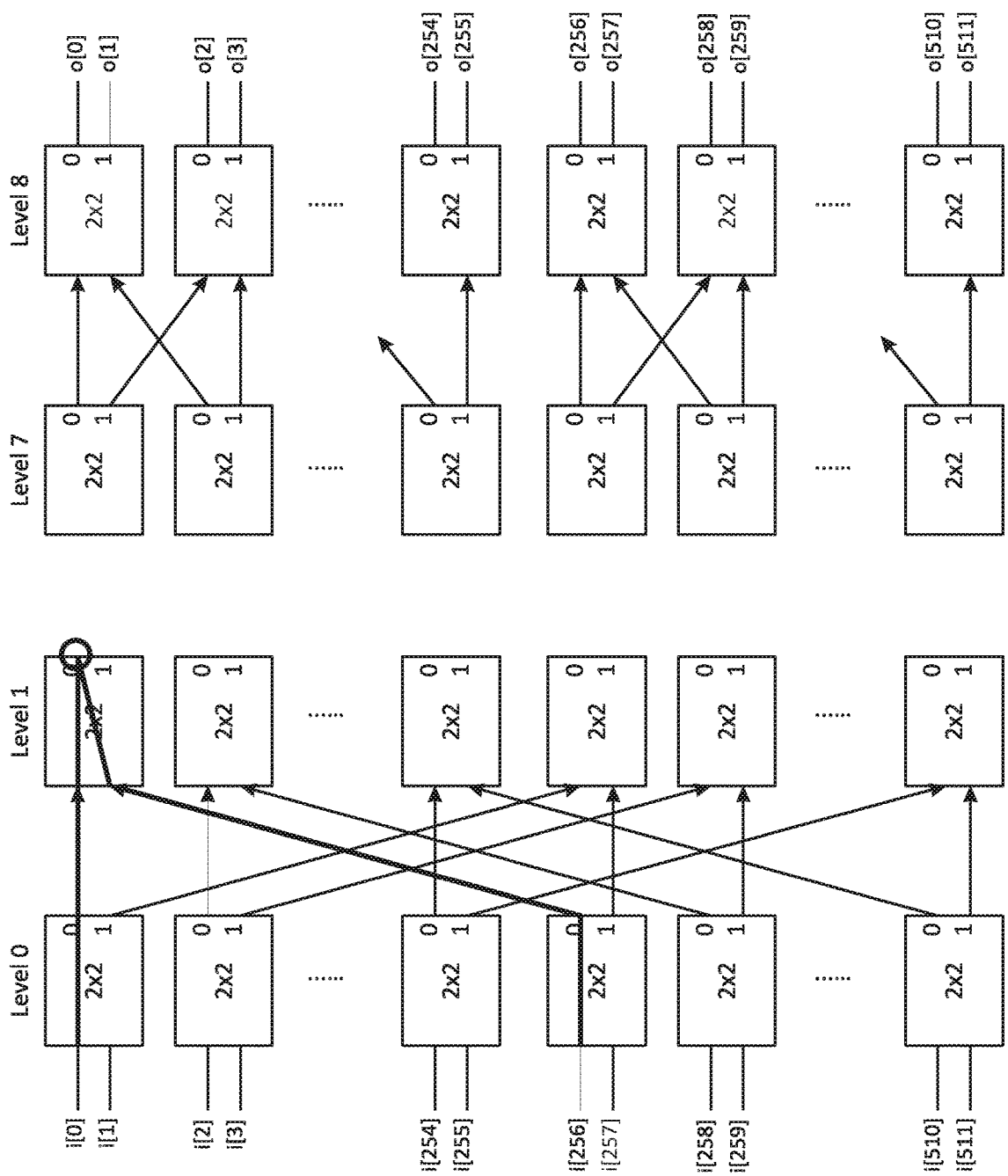
FIG. 18 is a block diagram that illustrates an example of a Banyon switch shown with and without conflicts, as implemented in embodiments of the present invention.

The design of FIGS. 16 and 17 uses the least amount of hardware resources. However, as shown in FIG. 18, the Banyan switch allows internal collisions and can drop data. For example, as shown in FIG. 18 for a 512×512 switch, if i[0] is routed to output port 'b00xxxxxxx and i[256] is routed to output port 'b00yyyyyyy, and if 'b00xxxxxxx is not equal to 'b00yyyyyyy, then the Banyan switch will drop data from these two ports at Level 1. But if i[2] is routed to output port 'b00aaaaaaa, then i[254] is routed to output port 'b00bbbbbbb, and so if 'b00aaaaaaa is not equal to 'b00bbbbbbb then the Banyan switch will pass both of these data elements beyond Level 1. If the two output ports for i[2] and i[254] are the only two input ports that have matching most significant bits (MSBs), then the two input ports can connect to their respective output port without collision. This means that, in order to solve collision problems, it is required to switch input location. For example, switching i[0] to i[2].

In embodiments, the 8×8 building blocks implement 2×2 crossbar sorting and switching elements having varying control configurations, as illustrated in FIG. 8 (cross bar switch using a 2:1 Mux) and 9 (Up and Down crossbar sorters). In FIG. 8, the 2×2 switching is controlled by a separate control line 800, for example from tag memory or from an address bit. The 2×2 Network Controls (i.e. collection of 2:1 Mux controls) can be generated from desired output Port Numbers either on-chip or off-chip. In FIG. 9, the up/down sorting is controlled by comparison result of multiple output port number bits, for example by a comparison of the most significant bits (MSBs) so that the inputs are sorted in ascending or descending order of their addresses.

Figure 10:
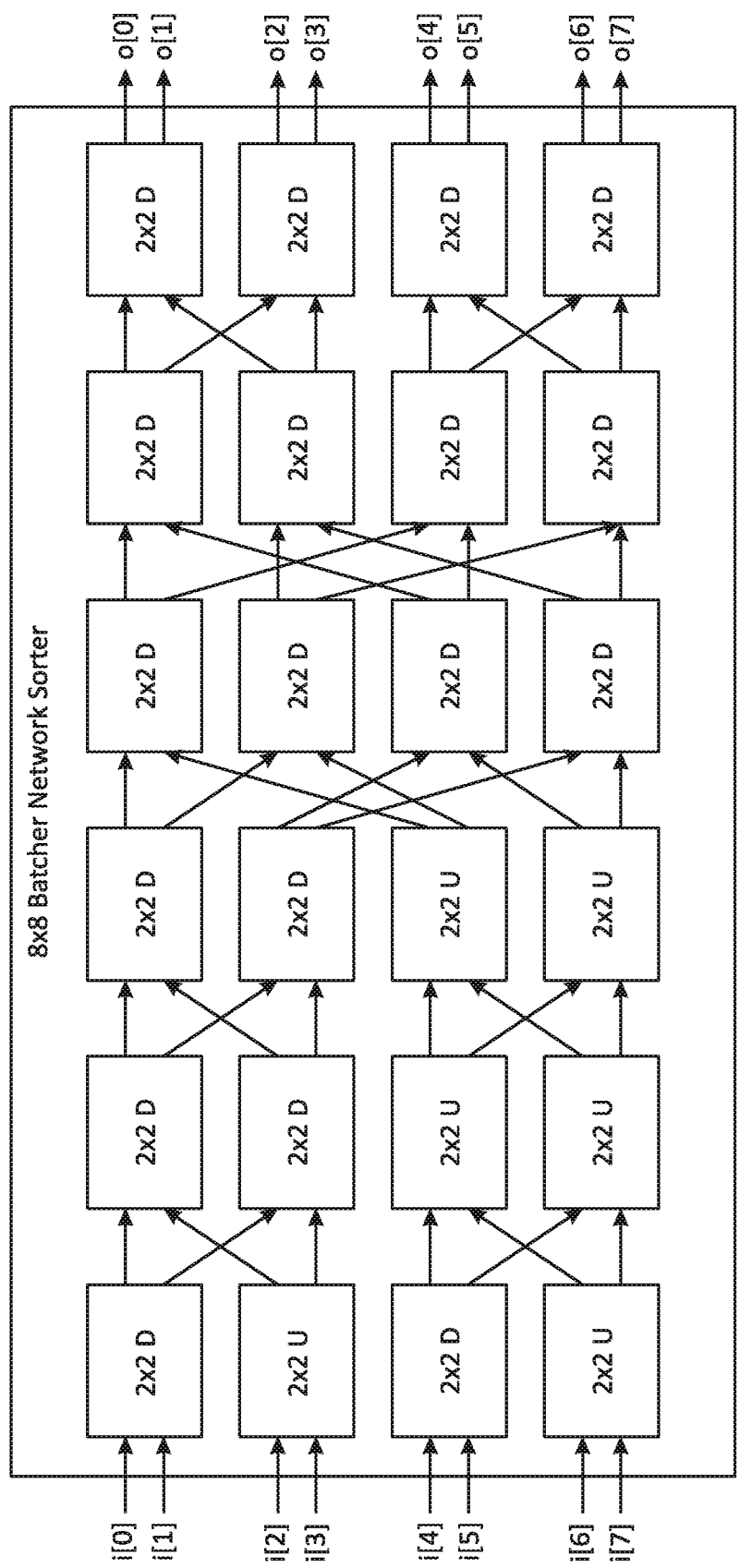
FIG. 10 is a block diagram that illustrates a batcher network sorter network as implemented in embodiments of the present invention.
Figure 11:
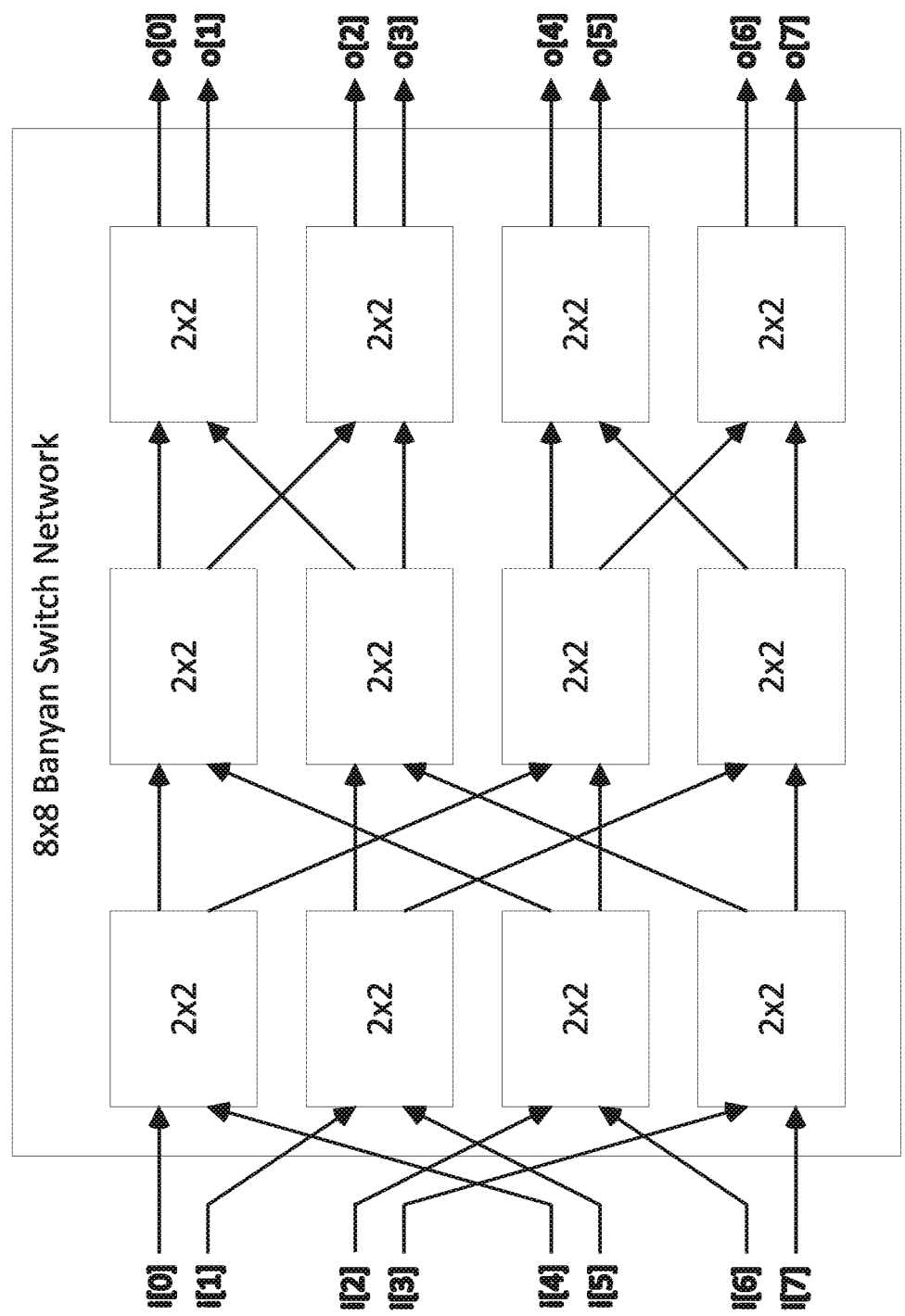
FIG. 11 is a block diagram that illustrates an 8×8 Banyan switch network as implemented in embodiments of the present invention.

Embodiments of the PROTS transport switch implement an 8×8 building blocks that each include a "Batcher Sorter" as illustrated in FIG. 10 followed by a Banyan Switch, as illustrated in FIG. 11. In FIG. 10, the switches are controlled by the comparison results (0/1) for the two corresponding output ports number bits. If the inputs are 0-7, each of which can be at any position i[0]-i[7], then the outputs are sorted according to: o[0]=0, o[1]=1, o[2]=2, o[3]=3, o[4]=4, o[5]=5, o[6]=6, and o[7]=7. In the Banyan switch of FIG. 11, the switches are controlled by output port number, (one bit each layer left to right, i.e. most significant to least significant). For this Banyan switch, if the inputs are in certain positions, it is possible to have internal conflicts.

The functionality of the Batcher Sorter is to output all input port data in ascending order of the corresponding output ports. When a Banyan switch is presented with this output of the Batcher Sorter, it will properly route the input ports to their corresponding output ports. However, without pre-processing by the Batcher sorter as a first step, the action of the Banyan switch could result in internal collisions, causing data to be dropped. In embodiments, comparison results of the three-bit output port number are used as controls for the Batcher sorter and individual output port bits are used as controls for the Banyan switch. Accordingly, the illustrated Batcher-Banyan 8×8 switch is non-blocking and self-routing. However, the Batcher-Banyan design cannot accommodate invalid reads or writes.

The Batcher-Banyan network of FIGS. 10 and 11 uses 6 layers (columns of 2×2 crossbars) for the Batcher module and 3 layers for the Banyan module, i.e. a total of 9 layers with four 2×2 crossbars per layer means 36 total 2×2 crossbars, each of which requires two Mux inputs, meaning that a total of 72 2:1 Mux inputs are required. The controls for this Batcher-Banyan switch are simple. Output port number bits can be used for Banyan control (per FIG. 8), and comparison results of output port number bits can be used to control the Batcher (per FIG. 9).

Figure 12:
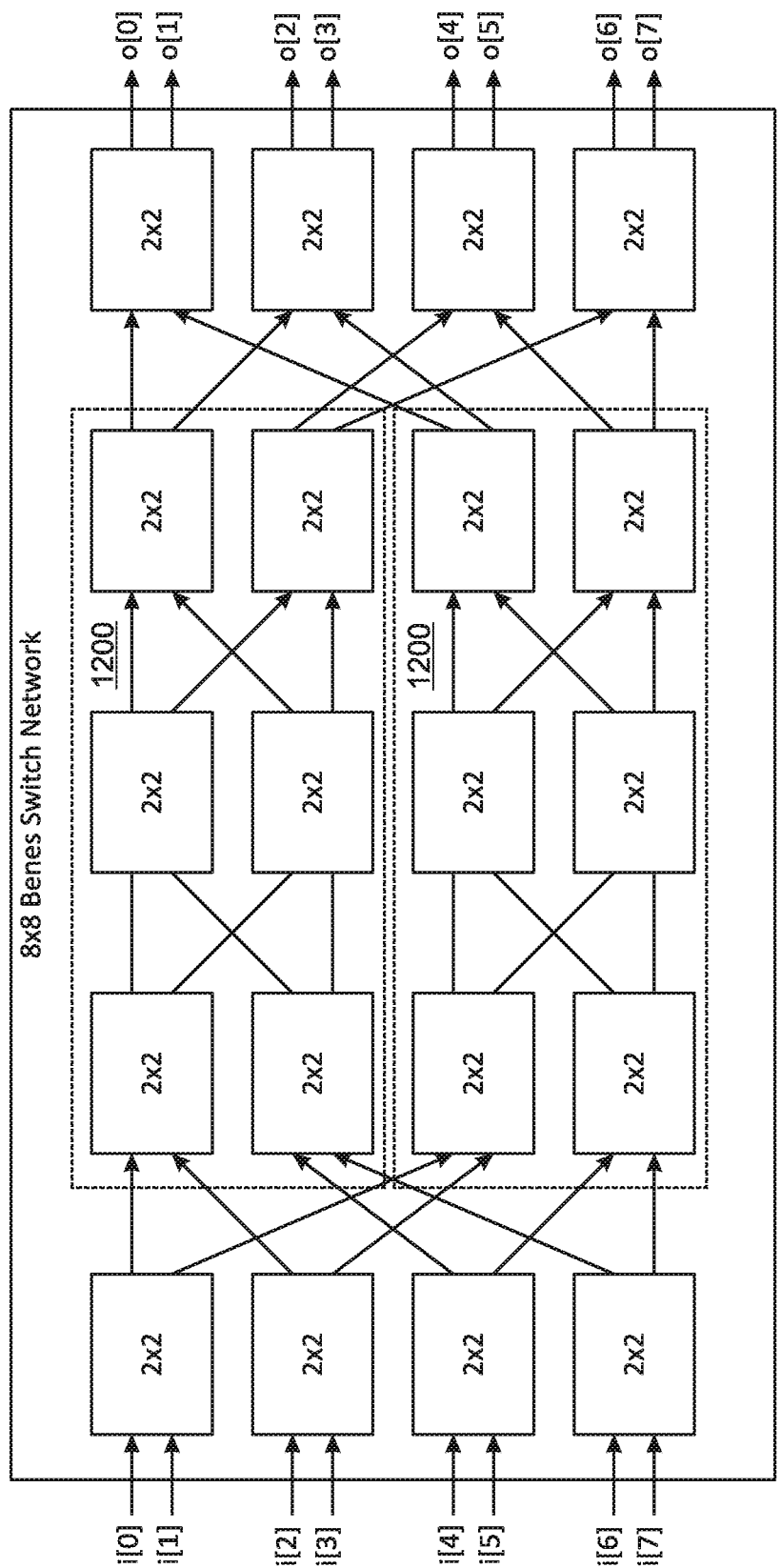
FIG. 12 is a block diagram that illustrates an 8×8 Benes switch network as implemented in embodiments of the present invention.

Other embodiments implement 8×8 building blocks based on a Benes network, as illustrated in FIG. 12. The Benes network is also a rearrangeable non-blocking configuration. For the illustrated network, the switches are controlled by control bits generated by I/O settings. If the input/output pairs are known beforehand, there is always a way to generate the controls for each switch to route them. It is in fact a Clos Network with n=2, m=2 and r=4. The 4*4 switches 1200 in the middle stage each consist of 3 layers of 2*2 crossbars. But the controls cannot be self-routing, and must be controlled by tag instructions stored in a tag memory and determined by applying a complicated routing algorithm. In principle, a tag instruction can be required for every memory access, i.e. every computing cycle, which can require a very large tag memory.

The Benes switch uses 5 layers, with four 2×2 crossbars per layer, times 2 Mux inputs per 2×2 crossbar for a total requirement of 40 2:1 Mux control inputs. Accordingly, the Benes switch design uses less hardware resources than the Batcher-Banyan. However, the algorithm that must be used to identify the controls for the Benes switch is more complex and requires significantly more tag memory. This is an example of trading complexity in input/output port pairing analysis against hardware resource requirements. A method of analyzing this tradeoff is discussed in more detail below.

Figure 13:
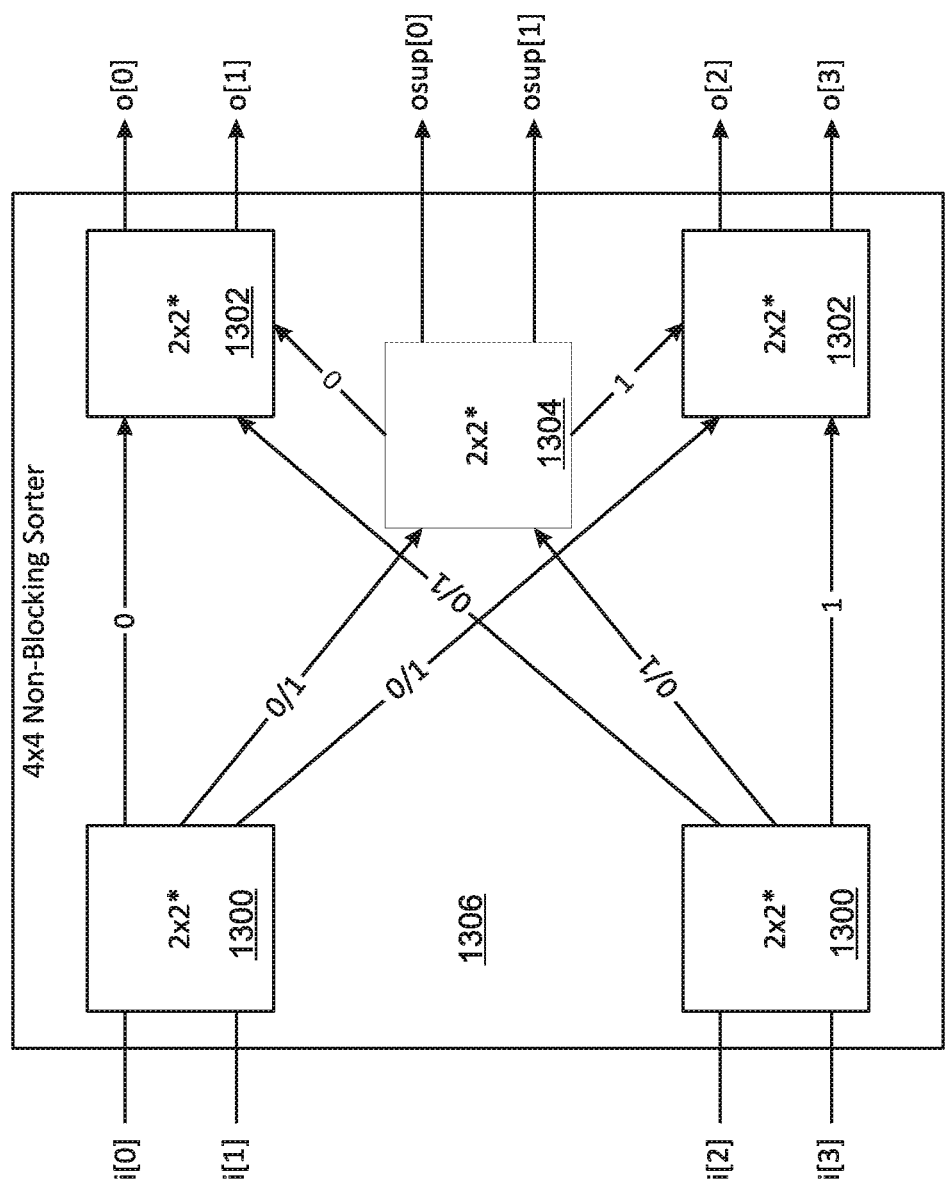
FIG. 13 is a block diagram that illustrates a 4×4 non-blocking sorter as implemented in embodiments of the present invention.
Figure 14:
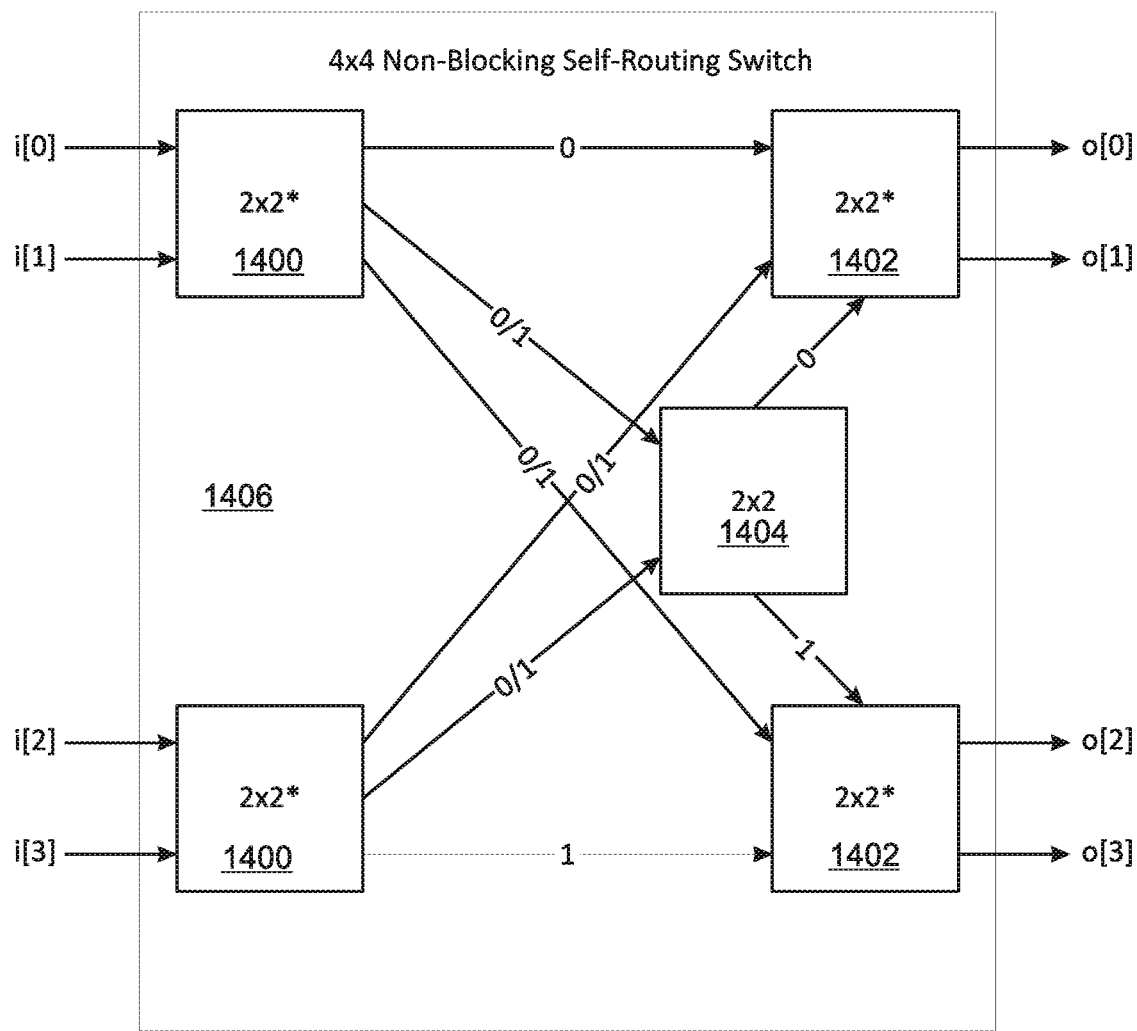
FIG. 14 is a block diagram that illustrates a 4×4 non-blocking switch as implemented in embodiments of the present invention.
Figure 15:
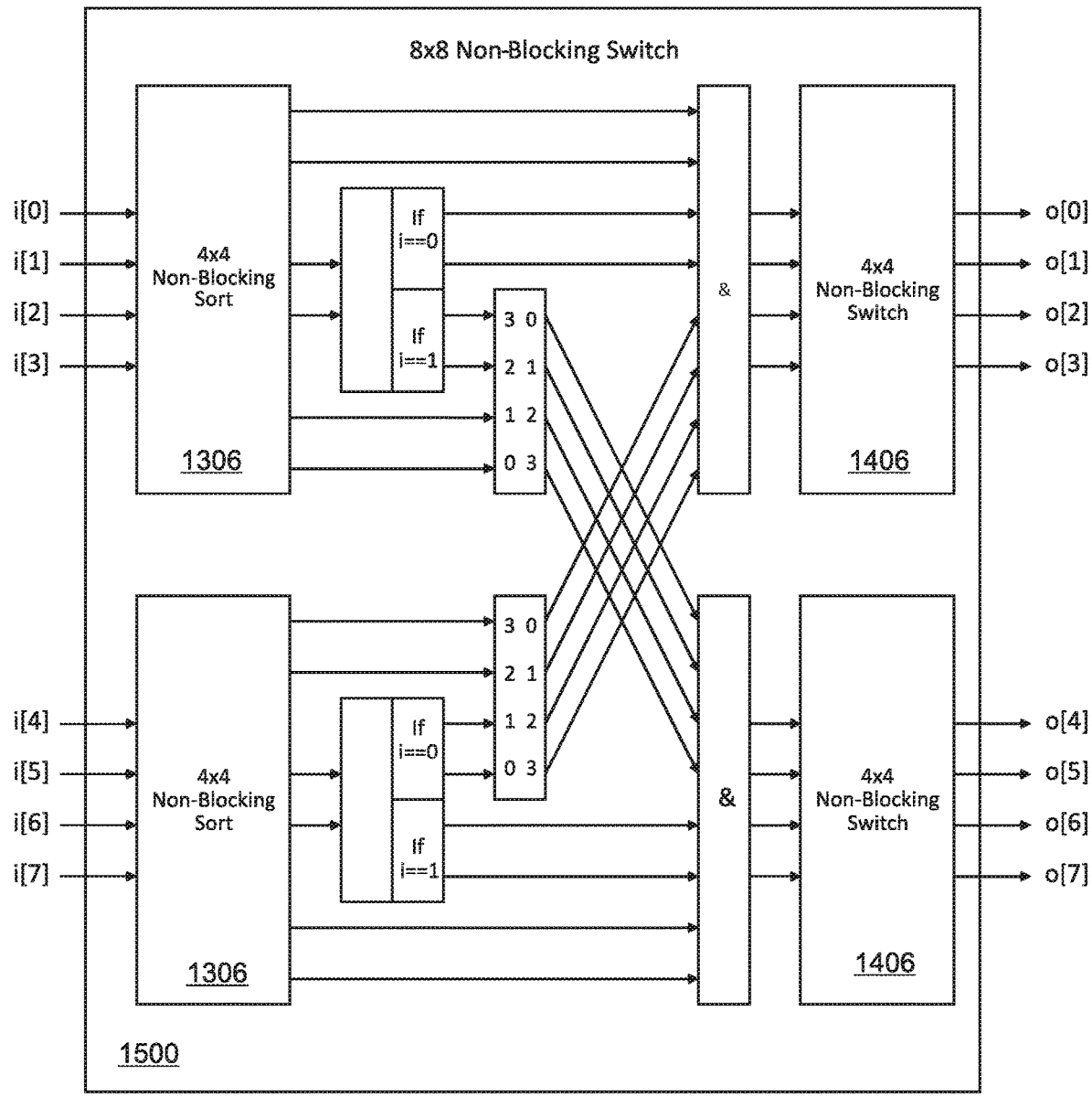
FIG. 15 is a block diagram that illustrates an 8×8 non-blocking, self-routing switch that incorporates two each of the 4×4 sorter of FIG. 13 and the 4×4 switch of FIG. 14, as implemented in embodiments of the present invention.

With reference to FIGS. 13-15, in exemplary embodiments of the present invention the N*N transport switch is constructed according to a novel design referred to herein as the "Partially self-Routed Octal Transport Switch" or "PROTS", which is based on 8×8 circuit-switched non-blocking, self-routing building blocks 1500 that interconnected to form the N*N switch. This design is intermediate between the above two examples, in that the PROTS design requires more hardware resources than the Benes switch but with less control complexity. In particular, the PROTS design is equivalent to 48 2×1 Mux with control circuitries that are somewhat more complex than for the Batcher-Banyan approach, but much lower in cost of hardware resources than Batcher-Banyan.

The 8×8 building blocks 1500 of the PROTS transport switch implement a "tri-state" logic, in that some of the input ports, output ports, and even internal ports included in sub-blocks within the 8×8 building blocks 1500 can take on a status of 0, 1, or "invalid." A designation of "invalid" can indicate that the port is "idle," wherein it is neither reading nor writing data as is common for example between input and output ports of CPU memory. Some output ports are "binary," in that they can be only 0 or invalid, only 1 or invalid, or only 0 or 1. However, the overall logic of the 8×8 building blocks incorporates three possible input/output states.

Each of the 8×8 building block switches in this novel architecture has 8 input ports that can be connected in any combination to 8 output ports, where the "self-routing" designation means that the internal configuration of the switch is determined directly from three address bits (hence the "Octal" terminology in "PROTS") that are provided to each input port to specify the desired output port, as numbered from 0 to 7.

More specifically, each of the 8×8 building blocks of the PROTS design incorporates two 4×4 sorters 1306 at the input, as illustrated in FIG. 13, with two 4×4 switches 1406 at the output, as illustrated in FIG. 14. The full 8×8 building block 1500 is illustrated in FIG. 15, where the highest output port address bit controls the 4×4 non-blocking sort, and the lowest two output port address bits control the 4×4 non-blocking switch. The building block of FIG. 15 tolerates invalid data, while directing other, valid data to desired output ports.

For the 4×4 non-blocking sorter of FIG. 13, the switch control is more complicated than for a Banyan switch. However, the 4×4 non-blocking sorter is controlled by a single output port address bit. In particular, the sorters 1306 of FIG. 13 are controlled entirely by the most significant bit ("MSB") of the 3-bit port address. The two input modules 1300 each have three outputs, as shown. In each case, if both inputs are "0" then the two inputs are routed to the upper two outputs, with the lowest output being set to "invalid." Similarly, if the two inputs are both "1" then the two inputs are routed to the lower two outputs, with the top output is set to "invalid." If one of the inputs is zero and the other is one, then the inputs are routed to the top and bottom outputs and the middle output is set to invalid. In each case, the address and data bits are routed from the two input modules 1300 to the remaining three modules 1302, 1304 as shown, which are also controlled by the same MSB of the address.

In FIGS. 13 and 14, "2×2*" indicates extra outputs carrying invalid control signals. As noted above, the inputs can tolerate invalid data, while other, valid data is routed to desired output ports.

Notably, each of the output modules 1302, 1304 of the sorters 1306 includes two outputs that are connected to outputs of the module o[0] through o[3] osup[0], and osup[1]. In particular, the middle output module 1304 includes two "supplemental" outputs indicated as osup[0] and osup[1]. As can be seen in FIG. 15, these two "supplemental" outputs from the middle modules 1304 can include bits that will ultimately be directed to either of the two 4×4 output switch modules 1406. Accordingly, the sorter modules 1306 effectively each provide 4×8 switching, even though each requires only five internal modules. Note that the first two outputs o[0] and o[1] will always be either 0 or invalid, while the final two outputs o[2] and o[3] will always be either 1 or invalid. The two "supplemental" outputs can have any of the three possible values.

The two 4×4 switches 1406 of each 8×8 building block 1500 are controlled by the second and third address bits. Specifically, the two input modules 1400 and the intermediate module 1404 are controlled by the second address bit, while the two output modules 1402 are controlled by the third or "least significant" ("LSB") of the three addressing bits. The two input modules 1400 have the same output pattern as the input modules 1300 of the sorter 1306 (but are controlled by the second address bit). The intermediate module 1404 directs each valid input to its "0" output if the second address bit of the input is 0, and to its "1" output if the second address bit is 1. The two output modules 1402 are controlled by the LSB bit in a straightforward manner. The pre-sorting of the ports by the sorters 1306 ensures that no conflicts will be encountered by the switches 1406.

A full N*N PROTS transport switch based on the 8*8 building blocks 1500 described above is illustrated in FIGS. 19 and 20, where FIG. 19 illustrates the N×N self-routing switch, and FIG. 20 illustrates the k section to k/8 section connection with 8×8 building blocks. The N section of FIG. 19 contains N/8 8×8 crossbar switches. For example, if N=512, there are a total of 3 types of sections in 3 levels, namely: Level 0: the 512 section (0); Level 1: 64 sections (0-7); and Level 2: 8 sections (0-63). In FIG. 20 the 8 outputs coming from the left that are directed into the 8 inputs of each 8×8 non-blocking switch on the right are separated by a distance of k/64. The j'th input of the i'th 8×8 section m is controlled by the following logic:

$$\text{for } (m = 0; m < 8; m++)$$
$$\text{for } (i = 0; i < k/64; i++)$$
$$\text{for } (j = 0; i < 8; j++)$$
$$in[8*i+j+k/64*m] = out[8*i+k/64*j+m].$$

The number of connections increases as levels go up since there are more sections in a level as the number of levels increases. FIG. 20 illustrates the connectivity for one section to 8 sections. For example, for N=512 there are three levels: Level 0 has a single connection to Level 1 for k=256 as shown, and Level 1 has 8 connections to Level 2 for k=64 as shown.

Figure 19:
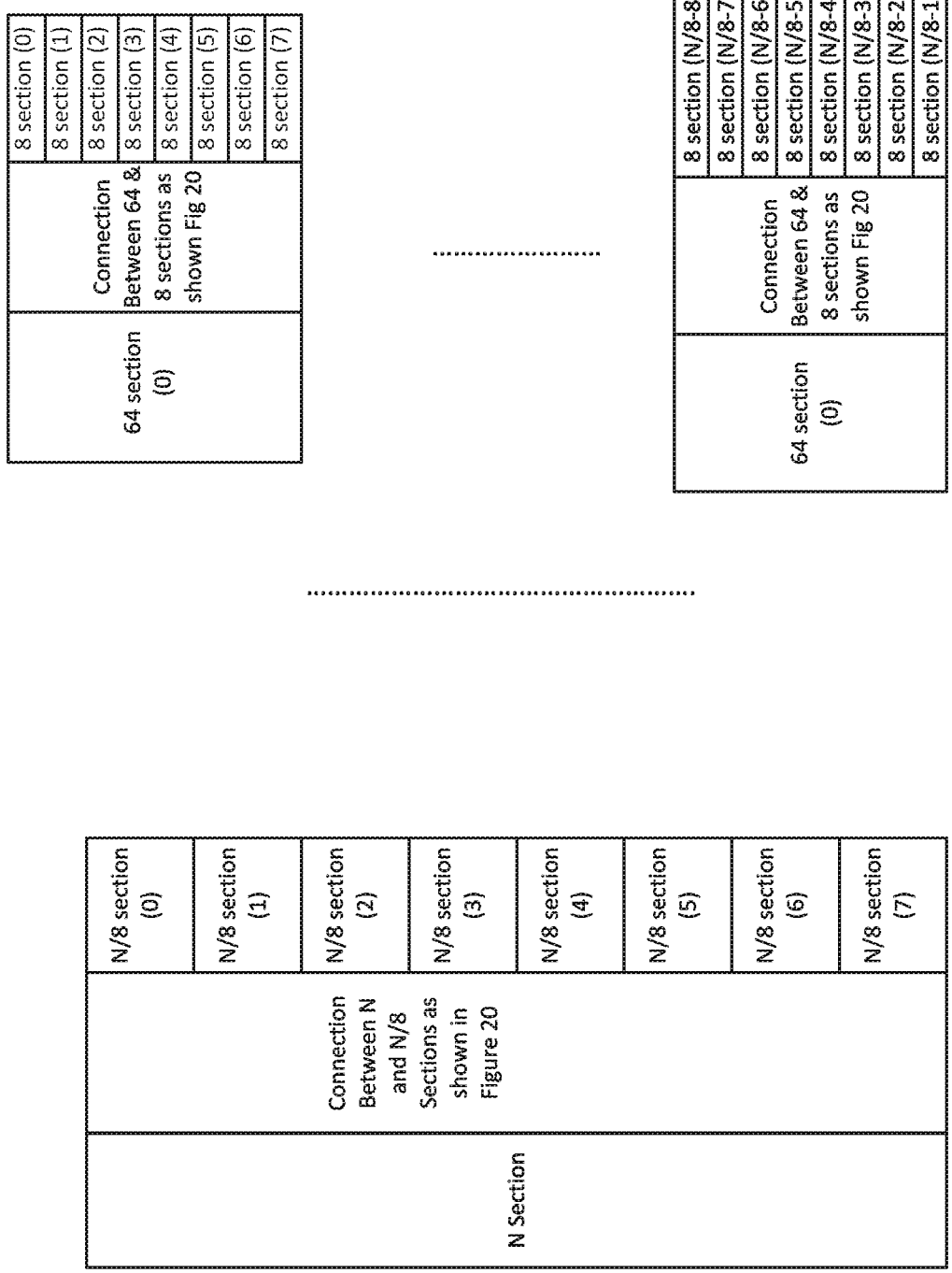
FIG. 19 is a block diagram that illustrates an N×N self-routing circuit switch as implemented in embodiments of the present invention.
Figure 20:
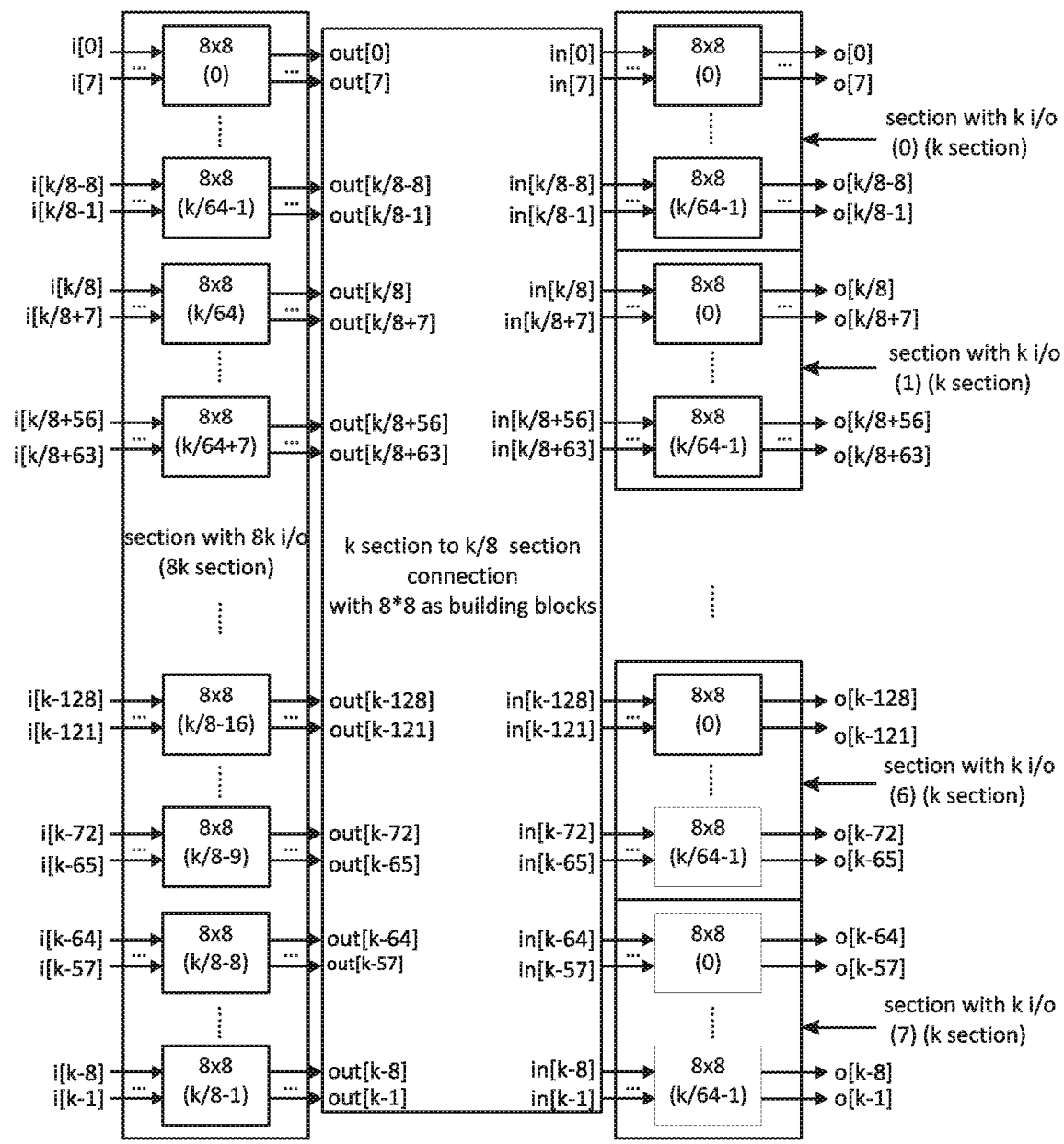
FIG. 20 is a block diagram that illustrates a section k-section to 8-section connection based on an 8×8 building block, as implemented in embodiments of the present invention.

In the design of FIGS. 19 and 20, collisions are still possible, but only between 8*8 switches. Accordingly, in embodiments a compiler is used to identify all possible collisions, and an additional "input position" or "−1" switch layer with extra ports is included in the PROTS transport switch before the "first" input layer, where the −1 switch layer is controlled by taps instructions and is used to switch input ports between the 8×8 modules so that collisions are avoided.

It should be noted that self-routing of a switch is only possible when each possible combination of input/output port interconnections can be provided by only one unique switch configuration, as is the case for the 8×8 building blocks 1500 of the PROTS transport switch. Accordingly, the 8×8 building blocks in the PROTS transport switch are configured directly by the three MSB addressing bits that they receive, and so do not require tag instructions. This feature increases predictability and simplifies verification of program instructions, and also significantly reduces the requirement for tag memory in the computing device, which is only used to store instructions that control the −1 layer, as well as the programming requirements for applications that are implemented on the device.

As shown in FIG. 20, the connections between two adjacent levels are governed by the requirement that the jth input of ith 8*8 in section m is given by:

$$\text{for } (m = 0; m < 8; m++) \qquad (1)$$
$$\text{for } (i = 0; i < k/64; i++)$$
$$\text{for } (j = 0; i < 8; j++)$$
$$in[(k/8)*m+8*i+j] = out[(k/8)*j+8*i+m]$$

where each m represents a section, each i represent an 8×8 switch, and each j represent a pin in the 8×8 switch.

Figure 21A:
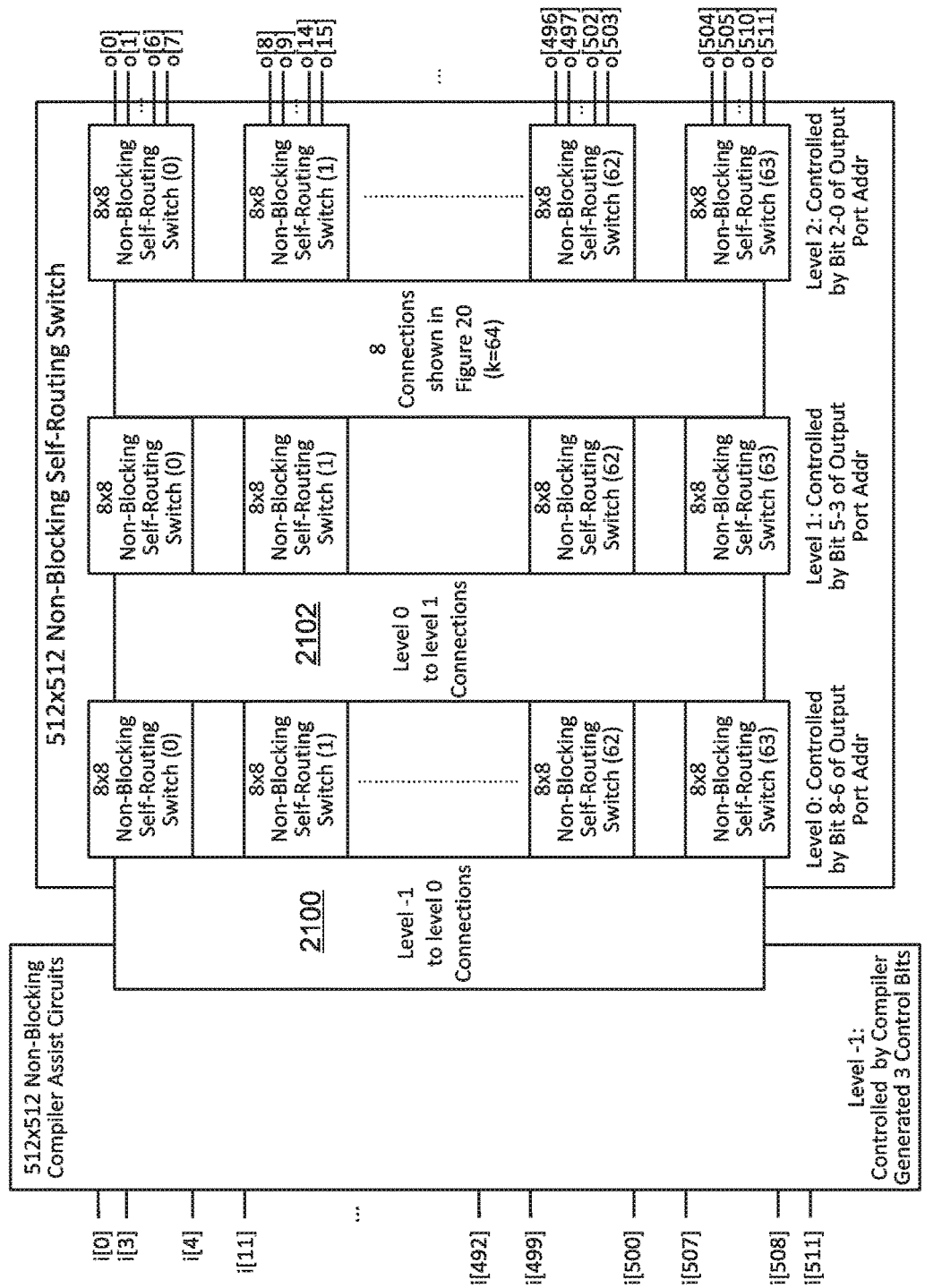
FIG. 21A is a block diagram that illustrates a 512×512 self-routing switch that includes assist circuits according to embodiments of the present invention.

FIG. 21A illustrates a 512×512 self-routing switch that includes assist circuits. In the illustrated design, internal conflicts will not occur within 8×8 non-blocking switches. However, conflicts can still occur between 8×8 non-blocking switches. In embodiments, a compiler generates 3 extra bits of control logic and the switching capacity is increased by 50% to avoid such conflicts and thereby guarantee that all data is passed to the desired destination port numbers. Using 50% more capacity in actual switching enables the input ports to be directed to a Level −1, arranged as: i[0]-i[3]: Invalid Data; i[4]-i[11]: Valid Data; i[12]-i[15]: Invalid Data; i[16]-i[23]: Valid Data; . . . i[492]-i[495]: Invalid Data; i[496]-i[503]: Valid Data; and i[504]-i[511]: Invalid Data. The 3 additional bits of control logic are then used to route the inputs to appropriate Level 0 inputs to avoid conflicts.

As shown in FIG. 21A, the illustrated embodiment provides approximately 50% more channels than are actually needed for reading and writing to the memory banks 306. As shown in FIG. 3 and FIG. 4, the illustrated transport read and write switches 302, 402 each have 340 Read/Write channels or input ports and 512 output ports. Accordingly, there are approximately 50% more ports available for switching to avoid collision. In the illustrated embodiments, either of the level −1 to level 0 connections 2100 and the level 0 to level 1 connections can be governed by the relationships of eqn. 1, while for the other of these two sets of connections 2100, 2102 the connections between two adjacent levels are governed by the requirement that the jth input of ith 8*8 in section m is given by:

$$\text{for } (m = 0; m < 8; m++) \quad (2)$$
$$\text{for } (i = 0; i < k/64; i++)$$
$$\text{for } (j = 0; i < 8; j++)$$
$$\text{in}[m + 64*i + 8*j] = \text{out}[k/8*m + 8*i + j]$$

Figure 21B:
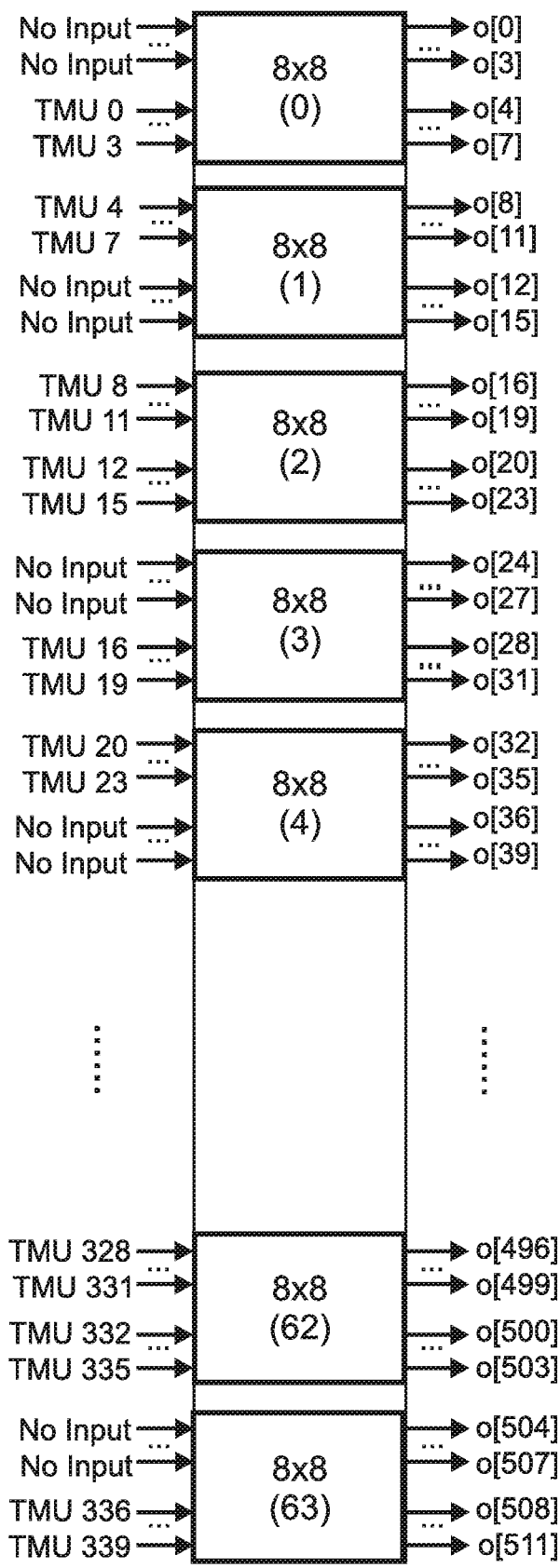
FIG. 21B is a block diagram showing details of the 512×512 Non-Blocking Compiler Assist Circuit of FIG. 21A in a first embodiment.
Figure 21C:
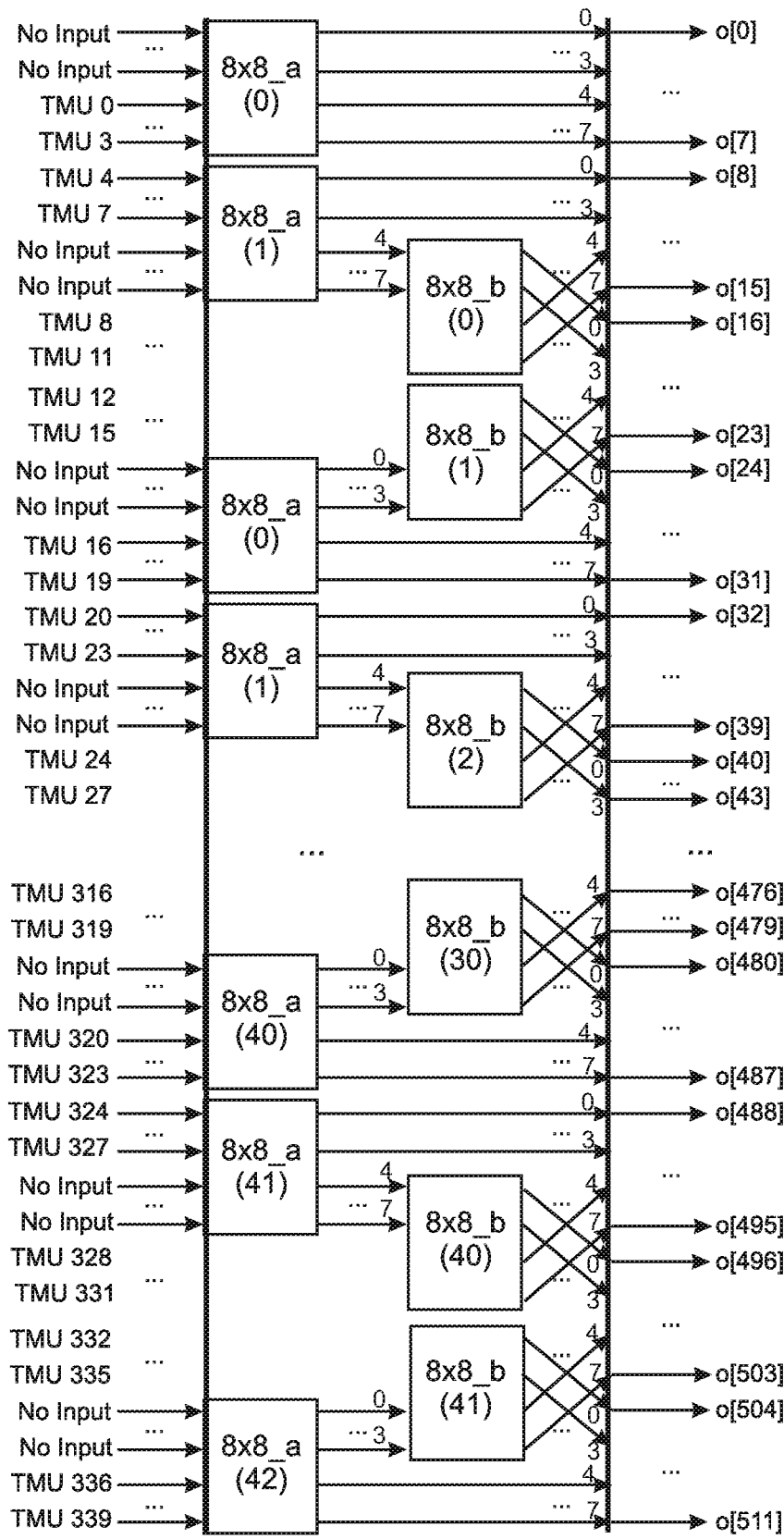
FIG. 21C is a block diagram showing details of the 512×512 Non-Blocking Compiler Assist Circuit of FIG. 21A in a second embodiment.

FIG. 21B presents a block diagram showing details of the 512×512 Non-Blocking Compiler Assist Circuit of FIG. 21A in a first embodiment, while FIG. 21C presents a block diagram showing details of a more flexible 512×512 Non-Blocking Compiler Assist Circuit of FIG. 21A in a second embodiment.

As shown, the input ports are arranged so that there are 4 invalid ports inserted between each group of 8 valid ports. This allows the input data locations to be switched using the same 8×8 switch 1500, thereby providing flexibility to switch the inputs to appropriate locations.

With the 8×8 switches connected as shown in FIG. 20, there are $\log_2 N/3$ layers of N/8 8×8 switches. These layers are defined as Level 0, Level 1, up to Level $\log_2 N/3-1$. Sections are defined within each layer such that Level 0 has 1 section, Level 1 has 8 sections, Level 2 has 64 sections, and so forth. When inputs reach the same section in a level, all of the MSBs that pertain to sections coming before that section (e.g. 3 MSBs for level 1, 3 next-most SBs for level, etc.) that are directed to corresponding output port numbers are the same.

For any specific N, it is possible to calculate the collisions from Level 0 to Level 1, from Level 1 to Level 2, so on and so forth. For a 512*512 switch, there are three levels, Level 0, Level 1 and Level 2. The above potential collisions can only occur between Levels 0 and 1 and between Levels 1 and 2. When these collisions are identified, the extra ports can be used in the extra −1 layer to switch the input port location and thereby avoid collisions. In these embodiments, collisions are only possible between Levels −1 and 0, Levels 0 and 1, and Levels 1 and 2.

Figure 22:
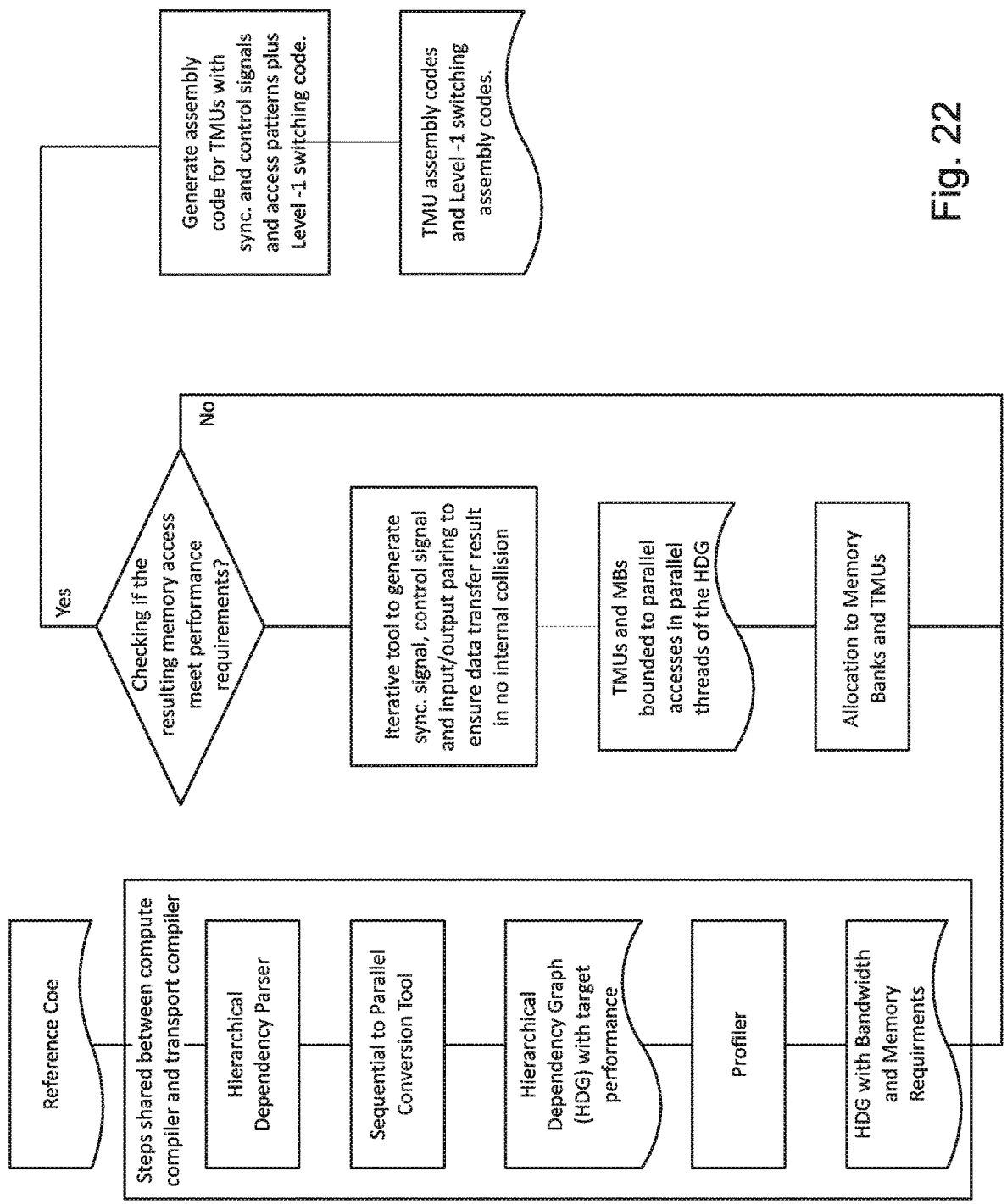
FIG. 22 is a flow diagram that illustrates the operation of a transport compiler as implemented in embodiments of the present invention.

With reference to the compiler flow illustrated by FIG. 22, another general aspect of the present invention is a method that can be implemented by a "transport compiler" to assist in creating application software that takes full advantage of the circuit switched memory access described above by executing the following steps:

1) Extracting function block dependencies.
2) Creating parallel thread pools across the execution time, and associating a start time signal with each of the pools that indicates the start of execution for that pool.
3) Proposing a range of read and write memory banks and a memory accessing pattern of the application as a function of time, as discussed in more detail below.
4) Using the pool-starting signals as time references, assigning to each thread a time slot and clock cycles in each period for accessing specific memory banks, and assigning computing resources for performing each of the threads. As a result, the transport switch input/output port pairs are known for each clock cycle.
   a) For each of these input/output port pairings, check whether the pairing results in any internal collisions in the transport switch
   b) Check whether the resulting data access times meets the execution time requirements for the application.
5) If there are no collisions and the execution time requirements are met, then memory access assembly code and synchronization code is generated for each of the TMU's. On the other hand, if there are collisions and/or the timing requirements are not met, then the method reverts back to step 3. Note that the first steps performed by the transport compiler can be shared with a primary compiler that is responsible for creating the software application.

Figure 23:
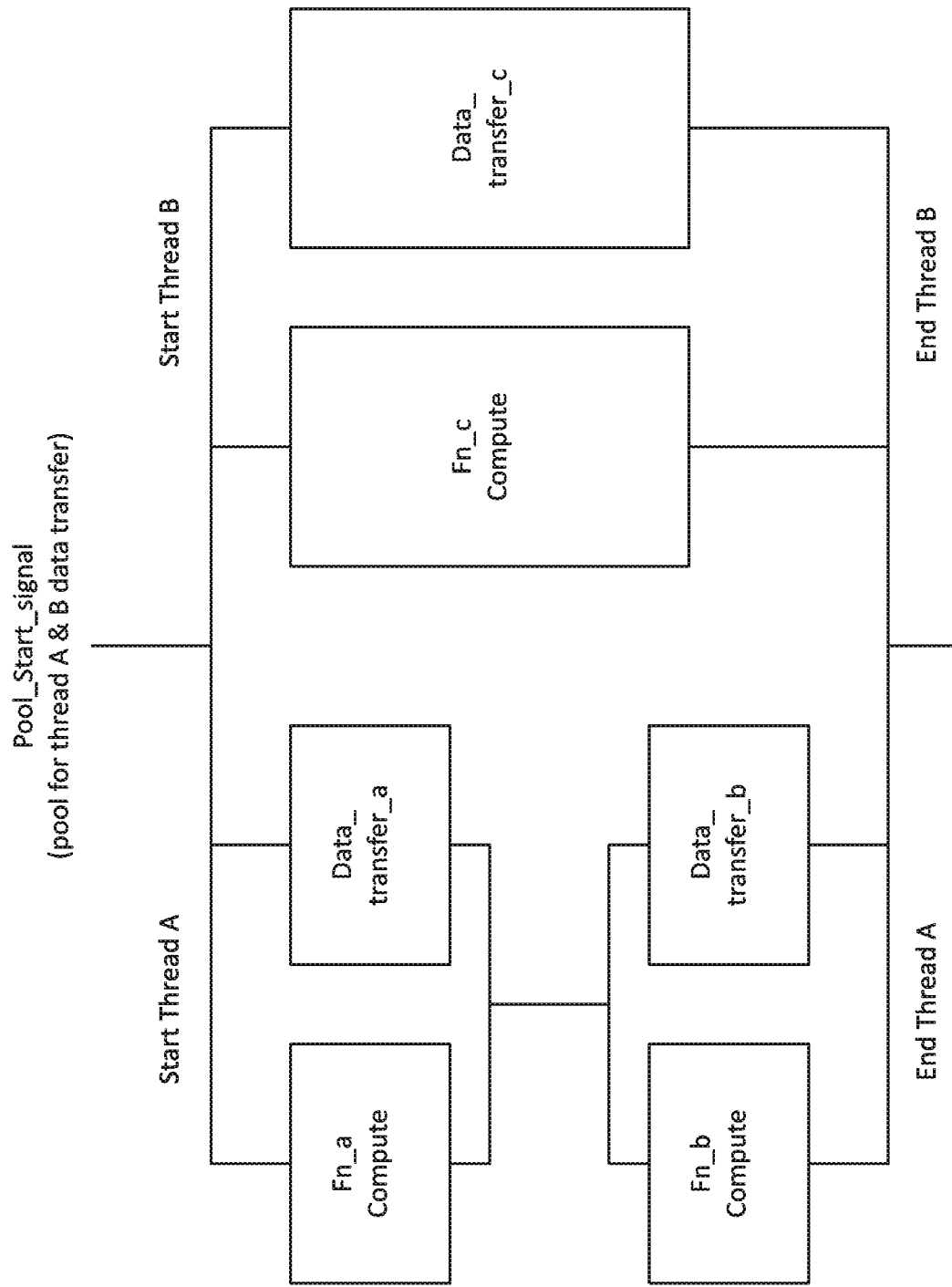
FIG. 23 is a block diagram that illustrates threads and their associated start time signals as implemented by a transport compiler in embodiments of the present invention.

An example of threads and their associated start-time signals is illustrated in FIG. 23. For each function block in a thread, optimal efficiency will generally be obtained when the corresponding data transfer's execution time is equal to the compute execution time. For example, for optimal efficiency, if the compute execution time for fn_a is 35 cycles, and the compute execution time for fn_b is 25 cycles, then data_transfer_a's execution time should be 35 cycles and data_transfer_b's execution time should be 25 cycles. If a data transfer is in parallel to a thread, then its execution time is the thread execution time. Accordingly, for optimal efficiency, if Fn_c's compute execution time is 50 cycles, data_transfer_c's execution time should be 35+25=60 cycles.

An iterative method that can be used by the transport compiler to generate data access patterns can include the following inputs:
List of TMU access memory bank ranges
Application requirements and their relative importance: Time and/or Power Consumption
Execution times for data transfer
The output of this method is an input/output port pairing for each cycle. The following are several rules that apply in embodiments when proposing a new range of read and write memory banks and a new memory accessing pattern of the application as a function of time:
If all data accesses are within range of a single 8*8 switch (e.g. all accesses are within MB[n*8]–MB[n*8+7]), then it is only necessary to check a single cycle of single TMU access of one of the MBs in its access range. (e.g. TMU0->MB0-MB3, check TMU0->MB0; TMU1>MB0-MB3, check TMU1->MB1; TMU2-> MB0-MB3, check TM2->MB2; TMU2->MB0-MB3, check TM2->MB3; . . . ). On the other hand, if at least one of the data accesses crosses a boundary between different 8*8 switches, it/they can be divided into multiple accesses that are within single 8*8 switches if the anticipated execution time permits this.
Alternatively, the rotation of a pattern can be checked. (e.g. TMU0->MB0-MB3, check TMU0->MB1;

TMU1>MB0-MB3, check TMU1->MB2; TMU2->MB0-MB3, check TM2->MB3; TMU2->MB0-MB3, check TM2->MB0; . . . )

If an access for a single TMU crosses a boundary between different 8*8 switches, then the entire input/output pair per clock cycle and its rotation during the access period must be checked.

The access pattern that maintains TMU-MB connections for as long as possible will have the lowest power consumption. Typically, this will be the access pattern that reads an entire column at a time.

Regarding specific input/output port pairings, FIG. 20 and its corresponding formula can be used to check for collisions. It is necessary to ensure that the number of valid outputs arising from Level 0, Level 1, and Level 2 is equal to the number of valid inputs. If so, this will ensure that there are no collisions.

If the check reveals that there is a collision, then the extra input ports can be used to switch the inputs to locations that do not lead to collisions. In embodiments, three control bits are assigned to control this "Level-1" switch.

In embodiments, the disclosed iterative method then applies a heuristic search to the above inputs to propose new input/output pairings and check them. Examples of this iterative method are shown in FIGS. 24-27, where FIG. 24 illustrates an example of shared memory access, FIG. 25 illustrates an Example of Separating Accesses into Regions, FIG. 26 illustrates a first example of a cycle-by-cycle access pattern, and FIG. 27 illustrates a second example of a cycle-by-cycle access pattern.

In FIG. 25, each of the four accesses has 4 or more lines that are within one non-blocking 8*8 except one column. During each cycle 4 TMUs access 4 MBs. The column that is not within the same 8*8–TMU3 region3 is separated assuming that the time requirement can be met. Then the remaining rows for TMU2 access MB2-MB5, regions 3 are separated. Finally, a single column of TMU1 is separated since it cannot be accessed in 4 rotations. If the TMU can rearrange the order of the data, then any column can be separated from MB1 to MB5, where MB5 is shown here. As a result, TMU0, TMU1, TMU2, TMU3 access region 1 and region 2 in 4 rotations, i.e. in 16 cycles.

In FIGS. 26 and 27, TMU1, TMU2, TMU3 access region 3 can be combined with other access patterns to save cycles. In FIG. 26, the illustrated pattern satisfies the constraints for each cycle 4 TMU's access to 4 MB. Other pattern may satisfy the same constraints if the TMU can rearrange order of the data. It is necessary to check other accesses to ensure there are no collisions. The illustrated pattern also has the shortest horizontal line delay.

In FIG. 27, the access pattern saves energy because the TMU to MB connection remain the same during 4 cycles. However, the horizontal line delay is longer than in FIG. 26.

If the program requires the horizontal line delay to be shorter, then the access pattern of FIG. 26 may be preferable.

Yet another general aspect of the present invention is a method of selecting an optimal hardware design for a specific implementation of the disclosed computing device with circuit-switched memory access.

For various traditional switch designs, a majority of the hardware resources are typically data path resources, because the data is conveyed in multiples of 16 bits. In embodiments of the present invention, the data is organized and conveyed as 64-bit lines or words. Since the control path typically uses fewer bits, data path hardware resource requirements can be used as a general measure of hardware design complexity. Table 1 below presents the data path resource usage and network characteristics for several types of switch design.

TABLE 1

Hardware resource usage in number of 2:1 Mux and characteristic of networks

| Number of 2:1 Mux Used | 64*64 | 512*512 | 4096*4096 | Non-Blocking? | Using Output Port Address as Control? | Complexity for Routing Algorithm to Generate Control |
|---|---|---|---|---|---|---|
| Banyan Switch | 384 | 2,304 | 24,576 | No | Yes | Low |
| Benes Switch | 704 | 4,352 | 47,104 | Yes | No | High |
| Batcher-Banyan | 1,728 | 13,824 | 184,320 | Yes | Yes | Low-Mid |
| Our Design | 1,152 | 6,144 | 61,440 | Yes | Yes | Mid |

As can be seen in Table 1, the hardware resource usage varies significantly between different switch types, and also varies according to the size of the switch. More importantly, when selecting a hardware design, it is important to consider what percentage of the entire IC will be devoted to the switch module and to tag memory. It is also important to consider the complexity of the routing algorithm that determines the input/output pairing if a routing compiler is needed. For example:

If an IC with shared memory naturally has its output ports addresses sorted in ascending order on its input ports (where the IC may or may not be a processor), then a Banyan network will require the least amount of hardware resources.

If the IC is an ASIC for which the input/output pairing changes very infrequently (e.g. once every month), then a routing compiler can be designed that requires a long time to run and uses the Benes switch, as discussed in more detail below.

If a processor requires frequent use of a routing compiler, then the design described herein and illustrated in FIGS. 10-16 will be optimal.

If the switch module represents only a very small percentage of the entire IC, then a Batcher-Banyan switch can be used without developing a routing compiler.

The above disclosure therefore describes a method of selecting a hardware design by balancing hardware resource requirements against compiler complexity, according to the above guidance regarding the application requirements for the IC.

Embodiments of the present invention use a transport compiler to match input/output pairs with specific paths. As discussed above, in embodiments the transport switch implements a Benes switch. This design:

uses the least amount of switching hardware resource (data path resources);

uses very complex control algorithms to determine the required tag instructions that control the switch; and
requires a large amount of tag memory to store the tag instructions.

Embodiments of the present invention separate the control algorithm into several parts:

Part A: a transport compiler matches a collection of input/output pairings generated from physical memory addresses (as discussed above) to a specific path.

Part B: the tag control bits for the specific paths are then stored in tag instruction memory on the chip and used to control the switch.

For example, if the design is a 512*512 switch for N=512, then 2*$\log_2$ N−1 layers are needed, where each layer includes 256 2*2 crossbars (by extension of FIG. 12 to 17 layers). Requirements include 17*256 bits=0.544 Kbytes per cycle of controlling tag instructions. For a maximum access period of 64 cycles, the requirement is approximately 32 Kbytpes of tag instruction storage. If the maximum access period is longer, then the required tag storage will be even greater. Nevertheless, this design can be suitable for some applications for which the memory access pattern is small and does not change often.

In embodiments, it is necessary for the transport compiler to choose memory access patterns according to application requirements. For example, as show in FIGS. 24-27, the timing patterns for accessing multiple 2D data blocks are different between FIGS. 26 and 27. In particular, the access method illustrated in FIG. 27 saves energy and leads to lower power consumption, because if the data is read one banks at a time or a column of data at a time, then the connection from the bank to the TMU is not required to change. The switch path therefore remains static during the entire reading the column. However, this method of access leads to longer horizontal line access time delays.

The transport compiler is therefore required to decide which access pattern to choose from. In embodiments, the decision is made based on individual program and application requirements. For example:

If for a given an application it is important to minimize power consumption (energy consumption), whereas the time required to complete a transaction is NOT highly important, then the transport will select the method illustrated in FIG. 27.

If strict timing requirements apply to an application, which can only be met by using the interlaced access method, then the compiler will select the method illustrated in FIG. 26.

For cases that are between these two extremes, a heuristics search program can be used to determine the best method based on application timing and power requirements, along with the program's parallelization output (e.g. the execution time requirement).

The above disclosure describes a method of balancing power consumption against access time requirements based on application and program requirements.

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure.

Although the present application is shown in a limited number of forms, the scope of the invention is not limited to just these forms, but is amenable to various changes and modifications without departing from the spirit thereof. The disclosure presented herein does not explicitly disclose all possible combinations of features that fall within the scope of the invention. The features disclosed herein for the various embodiments can generally be interchanged and combined into any combinations that are not self-contradictory without departing from the scope of the invention. In particular, the limitations presented in dependent claims below can be combined with their corresponding independent claims in any number and in any order without departing from the scope of this disclosure, unless the dependent claims are logically incompatible with each other.

We claim:

1. A computing device comprising:
a plurality of memory banks;
a plurality of memory clients; and
a transport switch having a plurality of first ports directed to the memory clients and a plurality of second ports directed to the memory banks;
the transport switch including a transport circuit switch that is configured to provide circuit-switched connection pairs between the first ports and the second ports so as to enable simultaneous data transfer connections between the memory banks and the memory clients during execution of a software application by the computing device;
the transport circuit switch being constructed using self-routing 8-bit×8-bit building blocks, each of which comprises at least one 4-bit×4-bit self-routing, non-blocking sorter and at least one 4-bit×4-bit self-routing, non-blocking switch.

2. The computing device of claim 1, wherein at least one batcher sorter is implemented in the transport circuit switch.

3. The computing device of claim 1, wherein at least one Banyan switch is implemented in the transport circuit switch.

4. The computing device of claim 1, wherein at least one Benes switch is implemented in the transport circuit switch.

5. The computing device of claim 1, wherein at least one self-routing switch is implemented in the transport circuit switch.

6. The computing device of claim 1, wherein the transport circuit switch includes a plurality of building block layers of the 8-bit×8-bit building blocks, and further includes an input position switch layer that precedes the building block layers.

7. The computing device of claim 6, wherein the input position switch layer is controlled by tag instructions that are stored in tag memory associated with the transport switch.

8. The computing device of claim 1, wherein at least some of the first and second ports are configured to accept invalid inputs.

9. The computing device of claim 1, wherein the transport circuit switch comprises:
a read switch configured to enable the memory clients to read data from the memory banks; and
a write switch configured to enable the memory clients to write data to the memory banks.

10. The computing device of claim 1, wherein each of the first ports includes a transport memory unit (TMU) interposed between the first port and the circuit switch.

11. The computing device of claim 1, wherein the transport switch is able to provide multicast transfer of data from at least one of the second ports simultaneously to a plurality of the first ports, thereby transferring the data to a plurality of the memory clients that is not necessarily all of the memory clients.

12. A method operable by a compiler of creating non-transient software code that is configured for execution by the computing device of claim 1 so as to cause the transport switch of claim 1 to enable efficient data exchange during execution of a software application between the memory banks and the memory clients of claim 1 while minimizing energy usage of the transport switch and while meeting timing requirements of the transport switch, the method comprising:

a) extracting function block dependencies;
b) creating a plurality of parallel program execution threads across an execution time;
c) associating a start time signal with each of the threads, wherein the start time signal indicates a start of execution for that thread;
d) proposing a candidate assignment of at least one of the memory banks to each of the threads and a candidate memory accessing pattern as a function of time for each of the threads;
e) using the start time signals as time references, for each of a plurality of program periods, assigning to each of the threads a time slot and a plurality of memory access clock cycles during which the thread will exchange data with its assigned memory banks;
f) assigning computing resources to execute the threads;
g) according to the memory bank assignments, memory accessing patterns, and memory access clock cycles, for each clock cycle of the application software program determining a configuration of first and second port pairings to be interconnected by a circuit switch during that clock cycle;
h) repeating steps d) through g) as needed until none of the port pairings results in an internal collision of the circuit switch, and the configuration of port pairings meets data access timing requirements of the application software program; and
i) generating memory access and synchronization code for the application software program.

13. The method of claim 12, wherein steps d) through f) are performed according to an approach that applies either a heuristic search or algorithmic programming to minimize energy use of the transport switch.

14. A method of selecting an architecture for a circuit switch to be included in a transport switch configured to provide intercommunication between a plurality of memory banks and a plurality of memory clients as described in claim 1, wherein the circuit switch is to be implemented on an integrated circuit (IC) having shared memory thereupon that will be accessible to the circuit switch by means of a plurality of memory access ports under control of an application program, the method comprising:

a) determining first and second time intervals;
b) determining a group of candidate circuit switch architectures that can be implemented by the circuit switch, said group including a Batcher-Banyan architecture, a Benes architecture, and a PROTS architecture constructed using 8×8 non-blocking, self-routing building blocks;
c) if the memory access ports have addresses that are sorted in ascending order, selecting the Banyan architecture from the group of architectures;
d) if a selection is not made according to c), then if the application program will not require changes to pairings of the first and second ports of the transport switch more frequently than once per second time interval:
selecting the Benes architecture from the group of architectures; and
configuring a transport compiler to determine the required pairings of the first and second ports of the circuit switch;
e) if a selection is not made according to c) or d), and if the transport switch will require assignment thereto of less than 10% of the IC's computing resources, then selecting the Batcher-Banyan architecture from the group of network architectures;
f) if a selection is not made according to c), d), or e), and if the application program will require changes to the pairings of the first and second ports of the transport switch more frequently than once per first time interval, then selecting the PROTS switch architecture from the group of network architectures; and
implementing a circuit switch on the IC that incorporates the selected architecture to provide switched circuit data intercommunication between the plurality of memory banks and the plurality of memory clients; and
g) if a selection is not made according to any of c) through f), then selecting an architecture that will minimize an area of silicon that will be occupied by the circuit switch.

15. The method of claim 14, wherein step g) includes selecting an architecture for which a total area of silicon occupied by the circuit switch is minimized, including a total area of silicon occupied by the building blocks of the circuit switch, and a total area of silicon occupied by tag memory associated with the circuit switch according to a size of each tag and a quantity of stored tags that will be required by the selected architecture.

16. The method of claim 14, wherein the first and second time intervals are one day and one week, respectively.

* * * * *